(12) United States Patent
Okuda et al.

(10) Patent No.: US 7,617,597 B2
(45) Date of Patent: Nov. 17, 2009

(54) COMPONENT PLACING METHOD

(75) Inventors: Osamu Okuda, Yamanashi (JP);
Youichi Tanaka, Ogoori (JP); Hiroyoshi Saitoh, Yamanashi (JP); Haneo Iwamoto, Sakai (JP)

(73) Assignee: Panasonic Corporation, Osaka (JP)

( * ) Notice: Subject to any disclaimer, the term of this patent is extended or adjusted under 35 U.S.C. 154(b) by 633 days.

(21) Appl. No.: 10/524,853

(22) PCT Filed: Sep. 10, 2003

(86) PCT No.: PCT/JP03/11558

§ 371 (c)(1),
(2), (4) Date: Feb. 18, 2005

(87) PCT Pub. No.: WO2004/026015

PCT Pub. Date: Mar. 25, 2004

(65) Prior Publication Data

US 2005/0235489 A1    Oct. 27, 2005

(30) Foreign Application Priority Data

Sep. 12, 2002   (JP)   ............................ 2002-266562
May 13, 2003    (JP)   ............................ 2003-134763

(51) Int. Cl.
H05K 3/30    (2006.01)

(52) U.S. Cl. ............................ 29/833; 29/834; 29/740; 456/400

(58) Field of Classification Search .................. 29/709, 29/712, 720, 739–743, 832–834, 759; 356/400; 382/151, 152, 145, 312; 414/754, 783; 901/44, 901/47; 348/126
See application file for complete search history.

(56) References Cited

U.S. PATENT DOCUMENTS

| | | | | | |
|---|---|---|---|---|---|
| 4,867,569 | A | * | 9/1989 | Mohara | 29/721 |
| 4,959,898 | A | * | 10/1990 | Landman et al. | 29/741 |
| 5,878,484 | A | * | 3/1999 | Araya et al. | 29/740 |
| 5,907,644 | A | * | 5/1999 | Yokota et al. | 382/312 |
| 5,920,397 | A | * | 7/1999 | Itoh | 356/400 |
| 6,211,958 | B1 | * | 4/2001 | Hachiya et al. | 29/759 |
| 6,404,912 | B1 | | 6/2002 | Lehnen et al. | |
| 6,573,987 | B2 | * | 6/2003 | Shires | 348/126 |
| 2001/0054229 | A1 | | 12/2001 | Link | |

FOREIGN PATENT DOCUMENTS

| | | |
|---|---|---|
| EP | 0 808 090 | 11/1997 |
| EP | 1 121 010 | 8/2001 |

(Continued)

*Primary Examiner*—Donghai D. Nguyen
(74) *Attorney, Agent, or Firm*—Wenderoth, Lind & Ponack, L.L.P.

(57) ABSTRACT

A component placing method uses a first component image-pickup unit capable of capturing an image of a component held by a component holding member from a direction along central axes of the component holding members, and a second component image-pickup unit capable of capturing an image of the held component from a direction generally orthogonal to the central axes of the component holding members, the images of the component are captured by the first component image-pickup unit and the second component image-pickup unit from the two directions generally orthogonal to each other, and holding postures of the components are recognized on the basis of the images.

2 Claims, 12 Drawing Sheets

FOREIGN PATENT DOCUMENTS

| | | |
|---|---|---|
| JP | 62-193199 | 8/1987 |
| JP | 9-293999 | 11/1997 |
| JP | 9-307297 | 11/1997 |
| JP | 10-209688 | 8/1998 |
| JP | 10-256790 | 9/1998 |
| JP | 11-74700 | 3/1999 |

* cited by examiner

COMPONENT PLACING METHOD

BACKGROUND OF THE INVENTION

1. Technical Field

The present invention relates to a component placing head and a component placing method that have a plurality of component holding members, capture an image of a component held by each component holding member, recognize a holding posture of the component, and place the component on a circuit board on basis of a result of the recognition.

2. Background Art

In recent years, markets have been increasing their demands for miniaturization, high performance, and reduction in cost of electronic equipment that contains electronic circuits formed by placement of electronic components as a plurality of components on circuit boards.

In an electronic component placing apparatus having a head, as an example of a component placing head, the plurality of electronic components are placed by the head on the circuit boards held on a stage and electronic circuits are thereby manufactured. In such an electronic component placing apparatus, holding postures of the electronic components held by the head, placement positions of the electronic components on the circuit board, and the like, are recognized by use of image-pickup devices provided on the stage or on the head, or the like, and the electronic components are placed on the circuit board on the basis of a result of the recognition (see Japanese unexamined Patent Publication No. 9-307297, for example).

In order to meet the demands from the markets, on the other hand, electronic component placing apparatus have been desired to cope with persistent miniaturization of the electronic components and the circuit boards and to perform placement with high density and high accuracy of the electronic components on the circuit boards and have been desired to achieve a decrease in time span required for the placement so as to fulfill efficient placement and a reduction in the manufacturing cost of electronic circuits.

Hereinbelow, an image-pickup device 210 provided in a head 200 in such a conventional electronic component placing apparatus will be described with reference to a fragmentary enlarged schematic explanatory view of the head 200 shown in FIG. 7. The head 200 has eight suction nozzles 201 as component holding members, arranged in a row, and FIG. 7 shows a section of the head 200 taken along a plane orthogonal to a direction of the arrangement.

As shown in FIG. 7, the head 200 has the eight suction nozzles 201 capable of sucking and holding electronic components 1 at extremities of the nozzles, and each suction nozzle 201 is supported by a head frame 202 so as to be capable of moving up and down along a central axis of the nozzle (in vertical directions in FIG. 7) and capable of rotating about the central axis.

As shown in FIG. 7, the image-pickup device 210 has a camera 211 that is provided to the left of the suction nozzle 201 in the drawing and that is capable of capturing an image of the electronic component 1 sucked and held by the suction nozzle 201, from underneath the electronic component in the drawing via two reflecting mirrors 212 and 213 placed on an optical axis of the camera. The image-pickup device 210 also has a linear guide rail 214 that is provided along the direction of the arrangement of the suction nozzles 201 to the upper left of the suction nozzle 201 in the drawing and that is fixed to the head frame 202. The camera 211 is supported by the head frame 202 through medium of the linear guide rail 214 so as to be capable of sliding along the linear guide rail 214, i.e., along the direction of the arrangement of the suction nozzles 201. A sliding device 215 for sliding the camera 211 along the linear guide rail 214 is fixed to the head frame 202 in neighborhood of a location where the linear guide rail 214 is installed.

When images of the electronic components 1 held by the suction nozzles 201 are captured by the image-pickup device 210, an image of the electronic component 1 held by each suction nozzle 201 is sequentially captured from underneath via the reflecting mirrors 212 and 213 while the camera 211 is slid by the sliding device 215 along the linear guide rail 214. Each image captured in this manner is subjected to recognition processing in a control unit, or the like, provided in the head 200 and is recognized as a suction holding posture of each electronic component 1 relative to each suction nozzle 201. The suction holding posture is then corrected by rotating of the suction nozzle 201, or the like, so that the recognized suction holding posture coincides with a placement posture relative to a circuit board, and the electronic component 1 is thereafter placed on the circuit board.

In the head 200 having the above structure, however, an image of the electronic component 1 held by the suction nozzle 201 is captured from underneath the electronic component 1, and it is therefore impossible to recognize a suction holding posture of the electronic component 1 with respect to the direction along the central axis of the suction nozzle 201 (i.e., the vertical direction in FIG. 7). For example, an electronic component 1 that is a minute electronic component such as a chip component is prone to be sucked and held in a position angled to the extremity of a suction nozzle 201 (what is called an angled position), it is difficult to recognize such a position on the basis of an image captured from underneath, and placement on a circuit board with such a position unrecognized may cause an error in the placement of the electronic component 1 on the circuit board or may cause a problem in that high-accuracy placement of electronic components cannot be achieved even if the placement error is avoided.

In the head 200, the sliding device 215 is provided on the head frame 202 in the neighborhood of the linear guide rail 214 and of the camera 211. Vibrations accompanying operation of the sliding device 215 are therefore prone to be transmitted through the linear guide rail 214 to the camera 211, and this causes a problem in that the camera 211 influenced by the vibrations cannot capture a high-accuracy image of an electronic component 1. An increase in the sliding velocity of the camera 211 slid by the sliding device 215, for the purpose of a decrease in a time span required for the placement of an electronic component 1 by the head 200, strengthens the transmitted vibrations and makes the above problem more noticeable, while a decrease in the sliding velocity for the purpose of a reduction in the vibrations fails to allow the decrease in the time span required for the placement and fails to allow efficient operation for placing electronic components.

In a head 200 provided with a board recognizing device for recognizing placement positions, or the like, for electronic components 1 on a circuit board, for example, the electronic components 1 can be placed with reliable recognition of the placement positions on the circuit board; however, recognition accuracy required of the board recognizing device differs with the required accuracy in placement of electronic components 1. Though a head 200 that is provided with a board recognizing device having a high recognizing accuracy so as to address the high-accuracy placement of electronic components is capable of addressing high-accuracy placement, a narrowed recognizable field of view of the device causes a problem, for example, in that placement of an electronic component 1 which does not require high-accuracy placement may rather increase a time span required for recognition and may lower a placing efficiency.

In order to address such high-accuracy placement of electronic components, it is necessary to capture a clear image of a placement surface of a component sucked and held by a suction nozzle. Though simple capture of the image with illumination of the placement surface of the component may address capture of images of conventional general-purpose components, the simple capture for miniaturized components, components with diversified shapes, and the like, may cause non-uniform illuminance, or the like, on their placement surfaces having miniaturized shapes, special shapes, and the like, and may thereby cause a problem in that images of the components cannot be captured clearly and in that such electronic components cannot be placed with a high accuracy.

Therefore, an object of the present invention is to solve the above-mentioned problems and to provide a component placing head and a component placing method that have a plurality of component holding members, capture an image of a component held by each component holding member, recognize a holding posture of the component, and place the component on a circuit board on the basis of a result of the recognition, the component placing head and the component placing method being capable of performing the recognition with a high efficiency and a high accuracy.

BRIEF SUMMARY OF THE INVENTION

In accomplishing these and other aspects, according to a first aspect of the present invention, there is provided a component placing head having a plurality of component holding members for releasably holding components, the members being arranged in a row, and the component placing head being capable of placing on a circuit board the plurality of components held by the component holding members, the component placing head comprising:

a first component image-pickup unit capable of capturing images of the components held by the component holding members from a direction along central axes of the component holding members;

a second component image-pickup unit capable of capturing images of the components held by the component holding members from a direction generally orthogonal to the central axes of the component holding members and to a direction of the arrangement of the component holding members;

supporting members for supporting the first component image-pickup unit and the second component image-pickup unit so as to allow movement thereof in the direction of the arrangement of the component holding members;

a moving device for moving the first component image-pickup unit and the second component image-pickup unit in the direction of the arrangement of the component holding members between the component holding members arranged at both ends of the row; and a control unit that causes the first component image-pickup unit and the second component image-pickup unit to sequentially capture the images of the components held by the component holding members while moving the first component image-pickup unit and the second component image-pickup unit by the moving device in the direction of the arrangement of the component holding members, and that is capable of recognizing holding postures of the components on the component holding members on the basis of the images of the components captured by the first component image-pickup unit and the images of the components captured by the second component image-pickup unit, wherein the components can be placed on the circuit board on the basis of the holding postures of the components recognized by the control unit.

According to a second aspect of the present invention, there is provided a component placing head having a plurality of component holding members for releasably holding components, the members being arranged in a row, and the component placing head being capable of placing on a circuit board the plurality of components held by the component holding members, the component placing head having:

a first component image-pickup unit having a plurality of image-pickup elements capable of capturing images of the components held by the component holding members from a direction along central axes of the component holding members, in one-to-one correspondence to the component holding members and with positional relations fixed among the image-pickup elements, and having reflectors that are positioned on a central axis of a component holding member so as to reflect an image of the component held by the component holding member from the direction along the central axes and so as to make the image incident along an optical axis of a corresponding image-pickup element on the image-pickup element;

a second component image-pickup unit capable of capturing images of the components held by the component holding members from a direction generally orthogonal to the central axes of the component holding members and to a direction of the arrangement of the component holding members;

a supporting member for supporting the reflectors of the first component image-pickup unit and the second component image-pickup unit so as to allow movement thereof in the direction of the arrangement of the component holding members;

a moving device for moving the reflectors and the second component image-pickup unit in the direction of the arrangement of the component holding members between the component holding members arranged at both ends of the row; and a control unit that causes the image-pickup elements to sequentially capture the images of the components held by the corresponding component holding members, through the reflectors, and causes the second component image-pickup unit to sequentially capture the images of the components held by the component holding members while moving the reflectors and the second component image-pickup unit by the moving device in the direction of the arrangement, and that is capable of recognizing holding postures of the components on the component holding members on the basis of the images of the components captured by the first component image-pickup unit and the images of the components captured by the second component image-pickup unit, wherein the components can be placed on the circuit boards on the basis of the holding postures of the components recognized by the control unit.

According to a third aspect of the present invention, there is provided a component placing head as defined in the first aspect, wherein the control unit is capable of recognizing holding postures of the components on the component holding members with respect to directions generally orthogonal to the central axes of the component holding members on the basis of the images captured by the first component image-pickup unit, and wherein the control unit is capable of recognizing holding postures of the components on the component holding members with respect to the directions along the central axes of the component holding members on the basis of the images captured by the second component image-pickup unit.

According to a fourth aspect of the present invention, there is provided a component placing head as defined in the third aspect, wherein the second component image-pickup unit is a line sensor having a phototransmitter and a photoreceiver that are arranged so as to face each other with interposition of the component holding members arranged in a row and being capable of capturing an image of a component by reception, on the photoreceiver, of light emitted from the phototransmitter toward the component held by the component holding member with a portion of the light interrupted by the component, and wherein the control unit is operable to recognize a holding posture of the component with respect to the directions along the central axes on the basis of capture result information obtained from the line sensor, detect a position of the line sensor moved by the moving device along the direction of the arrangement of the component holding members with the image capture, and identify the component of which the holding posture has been recognized from among the components on the basis of a result of the detection.

According to a fifth aspect of the present invention, there is provided a component placing head as defined in the first aspect, wherein the moving device has a drive motor for moving the first component image-pickup unit in the direction of the arrangement of the component holding members, and wherein the drive motor is provided so as to be opposed to the first component image-pickup unit with the component holding members between.

According to a sixth aspect of the present invention, there is provided a component placing head as defined in the fifth aspect, wherein the drive motor is provided so as to be opposed to the second component image-pickup unit also with the component holding members between.

According to a seventh aspect of the present invention, there is provided a component placing head as defined in the first aspect, wherein the first component image-pickup unit has:

image-pickup elements that use as optical axes thereof axes different from the central axes of the component holding members and that are capable of capturing images of the components held by the component holding members incident along the optical axes;

reflectors for reflecting an image of a component from the direction along the central axis of the component holding member, and thereby making the image incident along the optical axis of an image-pickup element on the image-pickup element;

a horizontal light emitting unit for emitting rays of light in generally horizontal directions directly onto a component imaging plane which is orthogonal to the central axis of the component holding member and in which the image of the component to be captured is obtained;

a vertical light emitting unit for emitting rays of light generally along the optical axis, so that the rays of light are reflected by the reflectors and travel in a direction along the central axis, and emitting the rays of light in generally vertical directions onto the component imaging plane; and an inclined light emitting unit for emitting rays of light inclined at a generally medial angle between the horizontal directions and the vertical directions, directly onto the component imaging plane, and wherein the control unit causes the image-pickup element to capture the image of the component in a status in which the horizontal light casting unit, the vertical light casting unit, and the inclined light casting unit are simultaneously casting rays of light onto the component imaging plane of the component held by the component holding member.

According to an eighth aspect of the present invention, there is provided a component placing head as defined in the seventh aspect, wherein the inclined light emitting unit has a plurality of illuminating sections for inclined light that are arranged so as to be symmetric and opposed to each other with respect to the central axis of the component holding member as an axis of symmetry, wherein the horizontal light emitting unit has a plurality of illuminating sections for horizontal light that are arranged so as to be symmetric and opposed to each other with respect to the central axis of the component holding member as an axis of symmetry, and wherein the illuminating sections are arranged in vicinity of a periphery of a zone in which the rays of light in the generally vertical directions from the vertical light emitting unit pass and which is formed on and around the central axis of the component holding member.

According to a ninth aspect of the present invention, there is provided a component placing head as defined in the eighth, wherein the inclined light emitting unit has two pairs of the illuminating sections for inclined light, wherein the horizontal light casting unit has two pairs of the illuminating sections for horizontal light, and wherein the illuminating sections for inclined light and the illuminating sections for horizontal light are alternately positioned with an angle pitch generally of 45 degrees on a plane extending along the component imaging plane of the component.

According to a tenth aspect of the present invention, there is provided a component placing head as defined in the seventh aspect, wherein the vertical light emitting unit has a shade plate that is provided on an imaginary straight line connecting the vertical light casting unit and the imaging plane of the component and that interrupts rays of light emitted from the vertical light casting unit along the imaginary straight line onto the component imaging plane.

According to an eleventh aspect of the present invention, there is provided a component placing head as defined in any one of the aspects the first through the tenth, further comprising a board image-pickup device capable of capturing an image of a specified position on a surface of the circuit board, wherein the board image-pickup device has, as two types of board image-pickup units having different fields of view for image capture and different resolving powers, a first board image-pickup unit having a narrower field of view and a higher resolving power than a remainder of the board image-pickup units, and a second board image-pickup unit having a wider field of view and a lower resolving power than the first board image-pickup unit, and wherein the control unit is operable to select either of the first board image-pickup unit and the second board image-pickup unit of the board image-pickup devices in accordance with an accuracy in placement of components on the circuit board, cause the selected board image-pickup unit to capture the image of the specified position on the surface of the circuit board, and recognize the specified position on the basis of the captured image.

According to a twelfth aspect of the present invention, there is provided a component placing method comprising:

holding a component releasably by each of a plurality of component holding members of a plurality of component holding members arranged in a row;

sequentially capturing images of the components held by the component holding members from a direction along central axes of the component holding members and sequentially capturing images of the components from a direction generally orthogonal to the central axes of the component holding members and to a direction of the arrangement of the component holding members;

recognizing holding postures of the components on the component holding members on the basis of the images captured from the direction along the central axes and the images captured from the direction generally orthogonal to the central axes and to the direction of the arrangement; and placing the components on a circuit board on the basis of the recognized holding postures of the components.

According to a thirteenth aspect of the present invention, there is provided a component placing method as defined in the twelfth aspect, wherein holding postures of the components on the component holding members with respect to the direction generally orthogonal to the central axes can be recognized on the basis of the images of the components captured from the direction along the central axes of the component holding members, and wherein holding postures of the components on the component holding members with respect to the direction along the central axes can be recognized on basis of the images of the components captured from the direction generally orthogonal to the central axes of the component holding members and to the direction of the arrangement of the component holding members.

In accordance with the first aspect of the present invention, the component placing head has the first component image-pickup unit for capturing the images of the components held by the component holding members from the direction along central axes of the component holding members, and further has the second component image-pickup unit for capturing the images of the components from the direction generally orthogonal to the central axes of the component holding members and to the direction of the arrangement of the component holding members. Thus the images of the components can be captured from the two directions generally orthogonal to each other, and the holding postures of the components on the component holding members can reliably be recognized on the basis of the images captured from the two directions.

In a condition that an image of each component is captured from the direction along the central axis for recognition of a holding posture thereof, as in conventional component placing heads, it is difficult to recognize a holding posture of a component that is a minute component, such as a small chip component, and that is held with a holding posture angled with respect to an extremity of a component holding member (such a case often occurs), for example, on basis of an image captured from the direction along the central axis. In the component placing head of the first aspect, by contrast, images of each component are captured from the direction generally orthogonal to the direction along the central axis as well as from the direction along the central axis and holding postures of the components are recognized on the basis of the images from the generally orthogonal direction also, so that the holding postures of the components held with an angled posture can be recognized reliably. Consequently, the holding posture of the component on each component holding member can be recognized reliably and accurately, each component can be placed on a circuit board on the basis of a result of the recognition, and high-accuracy placement of components can be achieved.

Also, the first component image-pickup unit and the second component image-pickup unit are supported by the supporting members and are provided on the component placing head so as to be capable of moving in the direction of the arrangement of the component holding members provided in the component placing head, and therefore images of the components held by the component holding members can sequentially be captured from the two directions by moving the first component image-pickup unit and the second component image-pickup unit in the direction of the arrangement, the movement being caused by the moving device. In the component placing head having the plurality of component holding members, accordingly, the images of the components can efficiently be captured from the two directions by the first component image-pickup unit and the second component image-pickup unit, and the image capture can be performed efficiently.

In accordance with the second aspect of the present invention, such effects as follows can be obtained in addition to the effects of the first aspect.

Initially, the plurality of image-pickup elements are provided in the first component image-pickup unit, in one-to-one correspondence to the component holding members and with positional relations fixed among the image-pickup elements, so that the image-pickup elements can be stationary during the image capture without being moved. Thus influences, such as vibrations, of the movement of the image-pickup elements can be prevented from occurring in the image capture by the first component image-pickup unit, and high-accuracy image capture can be achieved.

Also, the image-pickup elements are provided in one-to-one correspondence to the component holding members provided in the component placing head and with positional relations fixed among the image-pickup elements, and therefore positional relations between the component holding members and the image-pickup elements can be secured stably at all times, so that stable image capture can be achieved.

Also, the positional relations between the component holding members and the image-pickup elements are fixed, and thus the image capture can be performed if the vicinity of a general center of a reflecting surface, for example of the reflectors that can be moved, is positioned on a central axis of a component holding member. Accordingly, high-accuracy movement of the reflectors by the moving device may be unnecessary, and the necessity of the high-accuracy moving device can be obviated. As a result, high-accuracy image capture can be achieved by a simplified configuration of the apparatus.

With the image-pickup elements provided in one-to-one correspondence, relevant image data can be outputted for the control unit and recognition processing, and the like, can be started immediately after the image capture operation is completed in each image-pickup element. Accordingly, the recognition processing of the images can be started in the control unit before completion of the capture of all the images, so that a time span from the image capture to completion of the recognition processing can be shortened. As a result, efficient image capture and efficient placement of components can be achieved.

Furthermore, elements that are moved by the moving device can be limited to the reflectors and the second component image-pickup unit, thus a power of the moving device can be reduced, and a velocity of the movement can be increased for efficient image capture and efficient placement of components.

In accordance with the third aspect of the present invention, in the component placing head, the control unit that recognizes the holding postures of the components on the basis of the images from the two directions is capable of recognizing the holding postures of the components on the component holding members with respect to the directions generally orthogonal to the central axes of the component holding members on the basis of the images captured by the first component image-pickup unit, and the control unit is capable of recognizing the holding postures of the components on the component holding members with respect to the direction along the central axes of the component holding members on the basis of the images captured by the second component image-pickup unit. Accordingly, a component placing head can be provided that is capable of recognizing the holding postures of the components reliably and accurately from the two directions and that is capable of placing the components on the circuit boards with a high accuracy in the placement positions on the basis of a result of the recognition.

In accordance with the fourth aspect of the present invention, the line sensor composed of the phototransmitter and the photoreceiver that are arranged so as to face each other with the component holding members interposed is used as the second component image-pickup unit, thus an image of the component can be captured by the reception, on the photoreceiver, of light emitted from the phototransmitter toward the photoreceiver with a portion of the light interrupted by the component, and therefore a holding posture of the component with respect to the direction along the central axes can be recognized reliably and accurately on the basis of a condition of the interruption of the light as capture result information. With use of the line sensor, furthermore, a structure of the second component image-pickup unit can be simplified and a cost of the second component image-pickup unit can be reduced.

In the control unit, besides, the holding posture is recognized on the basis of the capture result information obtained from the line sensor, a position of the line sensor moved by the moving device along the direction of the arrangement is detected with the image capture, thus the component of which the holding posture has been recognized can be identified from among the components on the basis of a result of the detection, and the holding postures of the components can be recognized reliably.

In accordance with the fifth aspect of the present invention, the moving device has a drive motor for moving the first component image-pickup unit in the direction of the arrangement, the drive motor is provided so as to be opposed to the first component image-pickup unit with the component holding members between, and thus the vibrations that are transmitted from the drive motor with the drive of the drive motor can be reduced in the first component image-pickup unit. As a result, influence of the vibrations on the capture of the images of the components that is performed by the first component image-pickup unit can be reduced, the images of the components can be captured with a high accuracy, and the holding postures of the components can be recognized with a high accuracy.

In accordance with the sixth aspect of the invention, the drive motor is provided so as to be opposed to the second component image-pickup unit also with the component holding members between, and thus the vibrations that are transmitted from the drive motor can be reduced in the second component image-pickup unit also. As a result, the influence of the vibrations on the capture of the images of the components that is performed by the second component image-pickup unit can be reduced, the images of the components can be captured with a high accuracy, and the holding postures of the components can be recognized with a higher accuracy.

In accordance with the seventh aspect of the present invention, the first component image-pickup unit has the horizontal light emitting unit for emitting rays of light in generally horizontal directions directly onto the component imaging plane in which the image of the component to be captured is obtained, the vertical light emitting unit for emitting rays of light in generally vertical directions onto the component imaging plane, and the inclined light emitting unit for emitting rays of light inclined at a generally medial angle between the horizontal directions and the vertical directions, directly onto the component imaging plane, and thus the image of the component can be captured by the image-pickup element in a status in which the horizontal light emitting unit, the vertical light emitting unit, and the inclined light emitting unit are simultaneously emitting rays of light onto the component. Accordingly, the rays of light from the various directions can be shone on the component imaging planes of the components diversified with various shapes, so that occurrence of non-uniform illuminance on the component imaging plane can be reduced. Consequently, the images of the components can be captured with a high accuracy by the first component image-pickup device and high-accuracy mounting can be achieved.

In accordance with the eighth aspect or the ninth aspect of the present invention, the inclined light emitting units have the plurality of illuminating sections for inclined light that are arranged so as to be symmetric and opposed to each other with respect to the central axis of the component holding member as the axis of symmetry. The horizontal light emitting units have the plurality of illuminating sections for horizontal light that are arranged so as to be symmetric and opposed to each other with respect to the central axis of the component holding member as the axis of symmetry, and the illuminating sections are arranged in the vicinity of the periphery of the zone in which the rays of light emitted in generally vertical directions from the vertical light casting unit pass, and which is formed on and around the central axis of the component holding member, and thus the arrangements and configurations of the casting units can be made compact. Also, the inclined light emitting units have two pairs of illuminating sections for inclined light, the horizontal light emitting units have two pairs of illuminating sections for horizontal light, and the illuminating sections for inclined light and the illuminating sections for horizontal light are alternately positioned with an angle pitch generally of 45 degrees on the plane extending along the component imaging plane of the component. Accordingly, more compact arrangements and configurations can be achieved, and the rays of light emitted from the illuminating sections can be shown uniformly on the component imaging plane of the component. As a consequence, the first component image-pickup unit can be made compact, the degree of non-uniform illuminance on the component imaging plane can be reduced, and images of components with diversified shapes can be captured efficiently with a high accuracy.

In accordance with the tenth aspect of the present invention, the vertical light casting unit has the shade plate that is provided on the imaginary straight line connecting the vertical light casting unit and the imaging plane of the component and that interrupts rays of light cast from the vertical light casting unit along the imaginary straight line onto the component imaging plane, and the light leaking from the vertical light emitting unit can thereby be prevented from causing non-uniform illuminance on the component imaging plane, so that high-accuracy image capture can be achieved.

In accordance with the eleventh aspect of the present invention, the component placing head according to any one of the first to the fifth aspects has two types of board image-pickup units having different fields of view for image capture and different resolving powers, as the board image-pickup devices capable of capturing the image of the specified position on the surface of the circuit board, either of the board image-pickup units is used selectively in accordance with a placement accuracy on the circuit board of which the image is to be captured, and thus the image of the board can be captured efficiently. That is, the component placing head has the first board image-pickup unit having a narrower field of view and a higher resolving power than the remainder of the board image-pickup units, and has the second board image-pickup unit having a wider field of view and a lower resolving power than the first board image-pickup unit, and the control unit is capable of selecting either of the first board image-pickup unit and the second board image-pickup unit in accordance with the accuracy in placement of the component on the circuit board, causing the selected board image-pickup unit to capture the image of the specified position on the surface of the circuit board, and recognizing the specified position on basis of the captured image. Thus the component placing head can be provided that is capable of efficiently recognizing the specified position on the circuit board.

In accordance with the twelfth aspect of the present invention, images of the components held by the component holding members are sequentially captured from the direction along the central axes of the component holding members and are sequentially captured also from the direction generally orthogonal to the central axes of the component holding members and to the direction of the arrangement of the component holding members. Thus the images of the components can be captured from the two directions generally orthogonal to each other, and holding postures of the components on the component holding members can reliably be recognized on the basis of the images captured from the two directions.

That is, in a condition that an image of each component is captured from the direction along the central axis for recognition of a holding posture thereof, as in conventional component placing methods, it is difficult to recognize the holding posture of the component that is a minute component, such as a small chip component, and that is held with a posture angled with respect to an extremity of the component holding member (such a case often occurs), for example, on the basis of the image captured from the direction along the central axis. In the component placing method of the twelfth aspect, by contrast, images of each component are captured from the direction generally orthogonal to the direction along the central axis as well as from the direction along the central axis, and the holding posture of the component is recognized on basis of the image from the generally orthogonal direction also, so that the holding posture of a component held in an angled posture can be recognized reliably. Consequently, the component placing method can be provided wherein a holding posture of a component on each component holding member can be recognized reliably and accurately, wherein each component can be placed on a circuit board on basis of a result of the recognition, and wherein high-accuracy placement of components can be achieved.

In accordance with the thirteenth aspect of the present invention, on the basis of the images captured from the two directions, holding postures of the components on the component holding members with respect to the direction generally orthogonal to the central axes of the component holding members can be recognized on the basis of the images captured from the direction along the central axes of the component holding members, and holding postures of the components on the component holding members with respect to the direction along the central axes of the component holding members can be recognized on the basis of the images captured from the direction generally orthogonal to the central axes of the component holding members and to the direction of the arrangement of the component holding members. Thus a component placing method can be provided wherein a holding posture of each component can be recognized reliably and accurately from the two directions, and wherein each component can be placed on a circuit board with a high accuracy of placement position on the basis of a result of the recognition.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
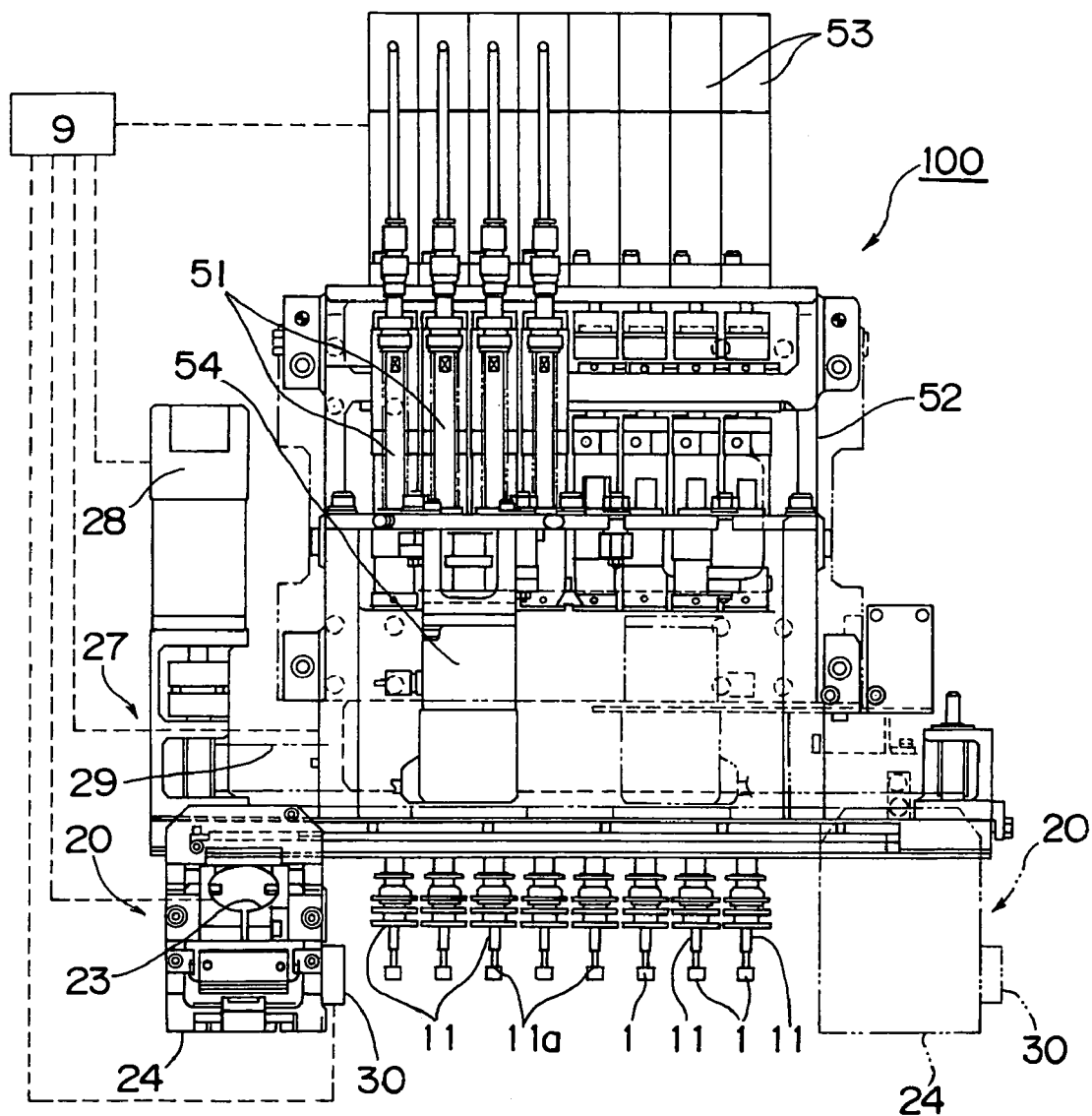
FIG. 1 is a schematic side sectional view of a head in accordance with a first embodiment of the present invention.

Before the description of the present invention proceeds, it is to be noted that like parts are designated by like reference numerals throughout the accompanying drawings.

Hereinbelow, embodiments of the invention will be described in detail with reference to the drawings.

First Embodiment

FIG. 1 shows a schematic side view (partly in section) of a head 100 that is an example of a component placing head in accordance with a first embodiment of the present invention.

As shown in FIG. 1, the head 100 has a plurality of (e.g., eight) suction nozzles 11 as an example of component holding members that are capable of releasably sucking and holding electronic components 1 as an example of components on holding surfaces 11a at extremities of the nozzles and that are arranged in a row with a uniform interval pitch.

The head 100 is provided on an XY robot, or the like, in an electronic component placing apparatus (not shown) so as to be capable of placing electronic components on circuit boards held on a stage of the electronic component placing apparatus. Specifically, a plurality of electronic components 1 fed by an electronic component feeding section of the electronic component placing apparatus are sucked and held by the suction nozzles 11 the head 100 has, the head 100 is moved to above a circuit board by the XY robot, an electronic component 1 sucked and held by a suction nozzle 11 of the head 100 is aligned with a placement position for the electronic component 1 on the circuit board, the suction nozzle 11 is subsequently lowered by the head 100, and thereby, the electronic component 1 can be placed on the placement position on the circuit board.

In the placement of such electronic components 1, images of an electronic component 1 sucked and held by each suction nozzle 11 of the head 100 are captured by component image-pickup units provided in the head 100, a suction holding posture of each electronic component 1 is recognized, a positional shift between the suction holding posture and a posture in which the electronic component 1 is to be placed on a circuit board is corrected on the basis of a result of the recognition, and the electronic component 1 is placed on the circuit board.

Figure 2:
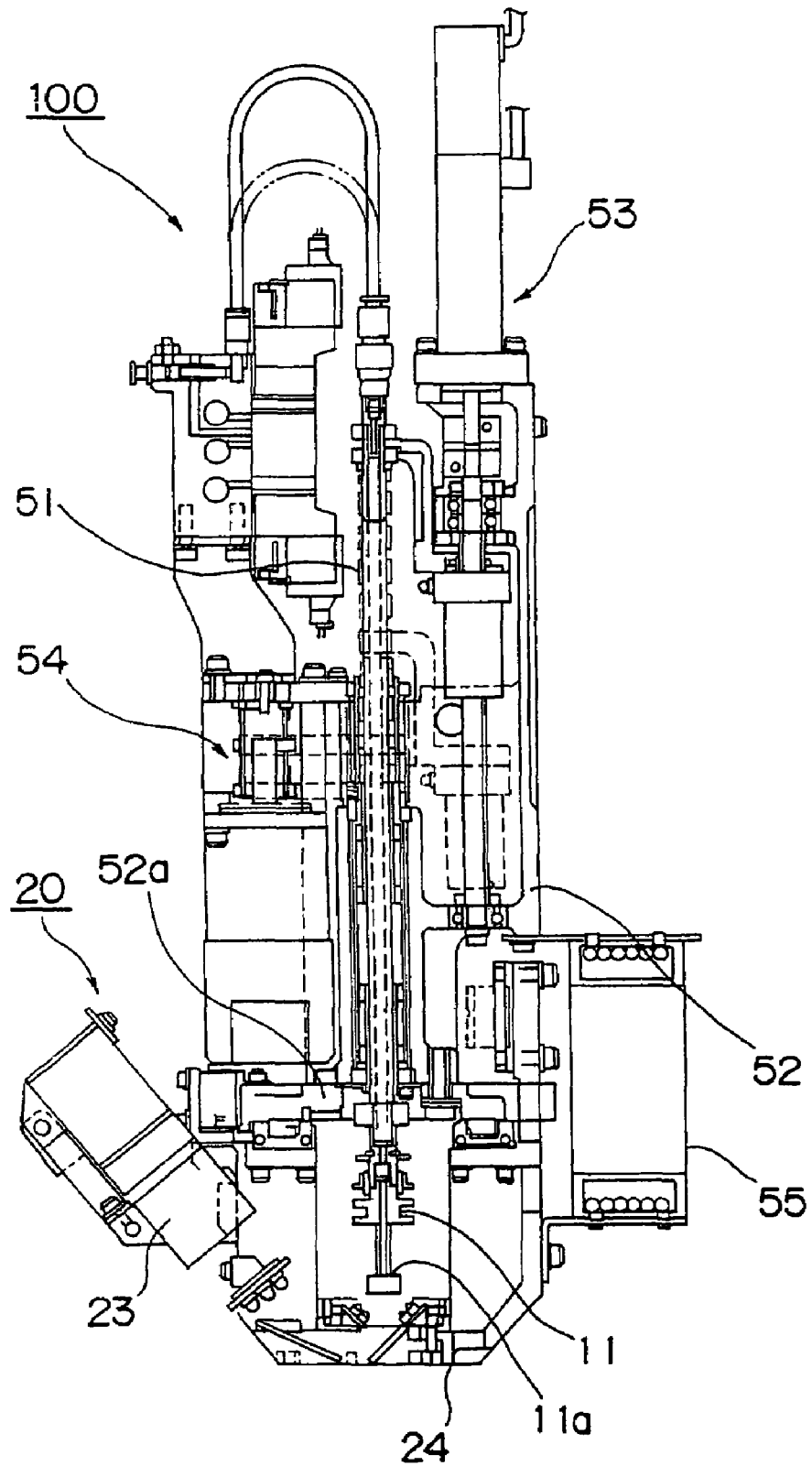
FIG. 2 is a schematic sectional view of the head of FIG. 1, taken along a plane orthogonal to directions of arrangement of suction nozzles.

Hereinbelow, a structure of the head 100 will be described in detail mainly on a structure of the component image-pickup units. FIG. 2 is a schematic sectional view of the head 100 taken along a plane orthogonal to direction of the arrangement of the suction nozzles 11.

In the head 100, as shown in FIG. 1 and FIG. 2, eight shafts 51 are arranged in a row at a uniform interval, and a suction nozzle 11 is detachably provided at an extremity of each shaft 51. Each shaft 51 is supported through spline nuts, bearings, and the like by a head frame 52 formed of a rigid body so as to be capable of moving up and down along a central axis of the shaft and rotating about the central axis. The head 100 has elevating devices 53 for moving each shaft 51 up and down and rotating devices 54 for rotating each shaft 51, and each elevating device 53 and each rotating device 54 are fixed to the head frame 52. For the elevating devices 53 a mechanism may be used that is conventionally used in such a head, e.g., a mechanism composed of a ball screw shaft and nuts (the mechanism used in this embodiment), a mechanism using an air cylinder, or the like. For the rotating devices 54 a mechanism may be used that rotates a shaft 51 with a belt (the mechanism that is used in this embodiment), a mechanism that directly rotates a shaft 51, or the like.

Figure 3:
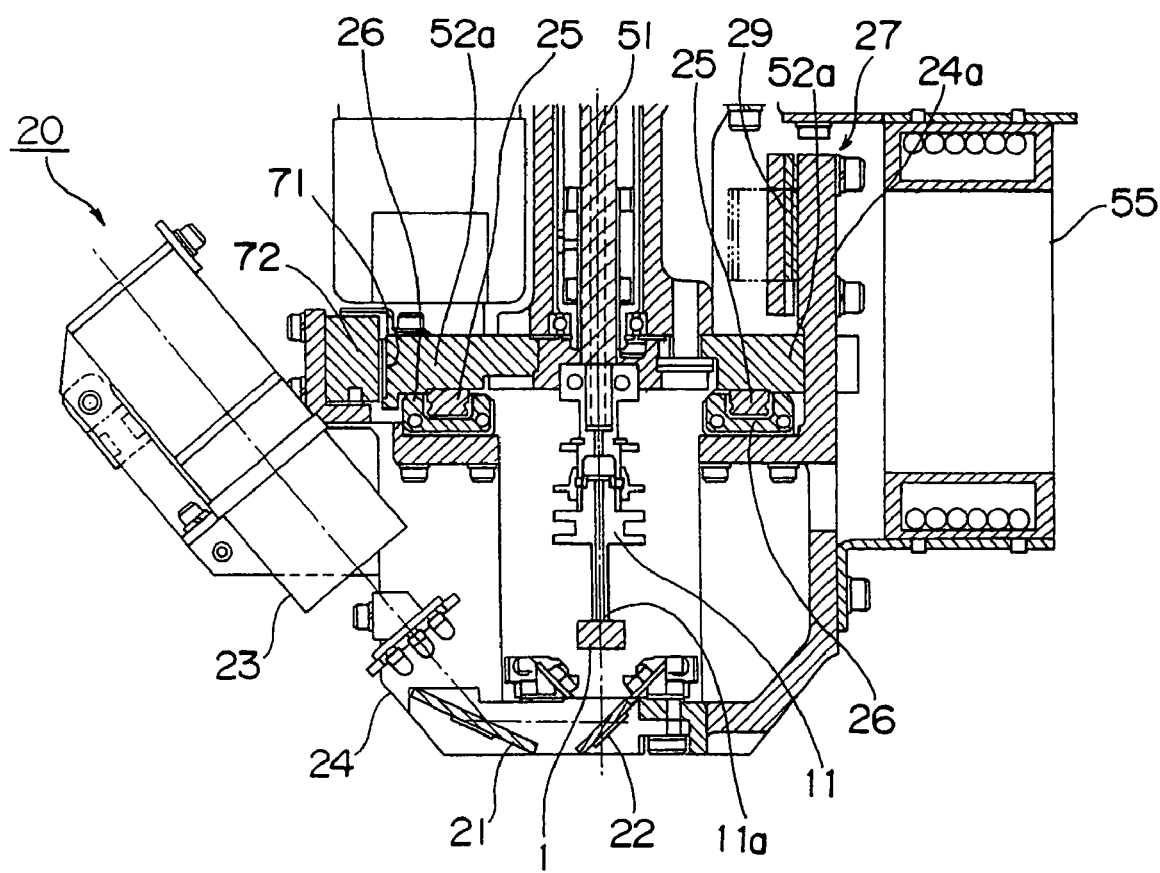
FIG. 3 is a fragmentary enlarged schematic sectional view of a component placement surface image-pickup device in the head.

As shown in FIG. 1 and FIG. 2, each suction nozzle 11 provided in the head 100 is in a status in which a holding surface 11a at an extremity of the nozzle is exposed from a lower frame 52a at a bottom of the head frame 52. On the lower frame 52a is provided a component placement surface image-pickup device 20 as a component image-pickup unit and as an example of a first component image-pickup unit capable of capturing an image of a placement surface that is on an underside of an electronic component 1 held by a suction nozzle 11 and that is to face a circuit board. FIG. 3 shows a fragmentary enlarged sectional view of the component placement surface image-pickup device 20.

As shown in FIG. 3, the component placement surface image-pickup device 20 has a camera 23 as an example of an image-pickup element that is provided to left of the suction nozzle 11 in the drawing and that is capable of capturing an image of the electronic component 1 sucked and held on the holding surface 11a of the suction nozzle 11, from underneath in the drawing via two reflecting mirrors 21 and 22 placed on an optical axis of the camera 23, i.e., that is capable of capturing an image of a placement surface (as an example of a component imaging plane) of the electronic component 1. The component placement surface image-pickup device 20 has an imaging frame 24 as an example of a supporting member that is provided so as to surround the suction nozzles 11 without interfering with the suction nozzles 11 and that has a cross section generally shaped like a letter "U," and the camera 23 and the reflecting mirrors 21 and 22 are fixed to the imaging frame 24 while keeping fixed the relative positions thereof.

As shown in FIG. 3, the camera 23 is provided so as to point downward in the drawing with the optical axis thereof inclined generally at about 40 degrees to the central axis of the suction nozzle 11 on a side of the suction nozzle 11. The reflecting mirror 21 as an example of a reflector provided on the left side in the drawing has a reflecting surface, on the optical axis, inclined toward the suction nozzle 11 generally at 65 degrees to the central axis of the nozzle, and the reflecting mirror 22 as an example of a reflector provided on the right side in the drawing has a reflecting surface inclined to an opposite side to the reflecting surface of the reflecting mirror 21, generally at 45 degrees to the central axis of the nozzle and positioned under the suction nozzle 11 on the central axis of the suction nozzle 11.

As shown in FIG. 1 and FIG. 3, the component placement surface image-pickup device 20 has two linear guide rails 25 (the linear guide rails 25 also are an example of supporting members) that are shaped like thin long bars and that are fixed to a lower surface of the lower frame 52a so as to extend along the direction of the arrangement of the suction nozzles 11 the head 100 has, and so as to face each other with the suction nozzles 11 between. With each linear guide rail 25, a linear guide slider 26 is engaged (the linear guide slider 26 also is an example of supporting members) that is fixed to each upper end of the cross section of the imaging frame 24 generally in shape of the letter "U" and that has a cross section generally shaped like a square bracket. The linear guide sliders 26 are capable of sliding in the longitudinal directions of the linear guide rails 25 (i.e., the direction of the arrangement of the suction nozzles 11) while engaging with the linear guide rails 25. That is, the imaging frame 24 that fixes and supports the camera 23 and the reflecting mirrors 21 and 22 is supported by the lower frame 52a through the linear guide sliders 26 and the linear guide rails 25, and is capable of sliding in the direction of the arrangement of the suction nozzles 11 while being guided by the linear guide rails 25.

As shown in FIG. 1 and FIG. 3, the component placement surface image-pickup device 20 has a slide drive unit 27 as an example of a moving device that slides the imaging frame 24 in the direction of the arrangement of the suction nozzles 11 with a guide by the linear guide rails 25. The slide drive unit 27 has a drive motor 28, and the sliding movement (reciprocating movement) of the imaging frame 24 in the direction of the arrangement can be effected by a drive of the drive motor 28 in either normal or reverse direction of rotation. As shown in FIG. 1, the drive motor 28 is fixed to the head frame 52 and, in FIG. 3 (the drive motor 28 is not shown in FIG. 3), a position of the fixation may be opposite to the camera 23 with the suction nozzles 11 between. That is, in FIG. 3, the camera 23 is positioned and fixed, on the left side of the suction nozzle 11 in the drawing, and the drive motor 28 is positioned and fixed on the right side of the suction nozzle 11 in the drawing, so that the drive motor 28 is installed far from a position where the camera 23 is installed.

As shown in FIG. 1 and FIG. 3, the slide drive unit 27 has a driving belt 29 that engages with a driving shaft of the drive motor 28 and that can be moved by the rotational drive of the drive motor 28. The driving belt 29 is provided along the direction of the arrangement of the suction nozzles 11, and a portion of the belt is fixed to an arm 24a that is a portion of the imaging frame 24 protruding upward on an upper right side in FIG. 3. With this configuration, the sliding movement of the imaging frame 24 can be effected by the rotational drive of the drive motor 28 through the driving belt 29 and the arm 24a. In the same manner as the position of installation of the drive motor 28, the driving belt 29 and the arm 24a are provided so as to be opposed to the camera 23 with the suction nozzles 11 between, in FIG. 3.

A range of the sliding movement of the imaging frame 24 by the slide drive unit 27 is between a position of the imaging frame 24 shown on left side in FIG. 1 (shown by solid lines) and a position of the imaging frame 24 shown on right side in the drawing (shown by phantom lines) That is, the sliding movement of the imaging frame 24 can be effected so that all of the eight suction nozzles 11 provided in the head 100 may pass inside of the cross section of the imaging frame 24 that is generally shaped like the letter "U."

The imaging frame 24 is capable of sliding in this manner, so that the camera 23 and the reflecting mirrors 21 and 22 which are fixed to the imaging frame 24 are capable of sliding together with the imaging frame 24 as described above while keeping fixed the relative positions thereof. With this arrangement, an image of each electronic component 1 sucked and held on the holding surfaces 11a of the eight suction nozzles 11 the head 100 has can be captured by the camera 23 from underneath each component (i.e., from a direction along the central axes of the suction nozzles 11) via the reflecting mirrors 21 and 22.

The component placement surface image-pickup device 20 is provided with a plurality of illuminating units that are capable of emitting light along the optical axis of the camera 23 to irradiate with the light an electronic component 1 sucked and held by a suction nozzle 11, and an image of each electronic component 1 is captured with the illuminating units lighted.

The head 100 has a component thickness image-pickup device 30 that is an example of a second component image-pickup unit, as another one of the component image-pickup units. The component placement surface image-pickup device 20 captures an image of an electronic component 1 sucked and held on each suction nozzle 11, from underneath each component from a direction along the central axis of the suction nozzle 11 in order to capture an image of a placement surface of the electronic component 1, whereas the component thickness image-pickup device 30 captures an image of each electronic component 1 from a direction generally orthogonal to the central axis of each suction nozzle 11 and to the direction of the arrangement. That is, the device 30 is capable of capturing an image of an electronic component 1 from a lateral side.

Figure 4:
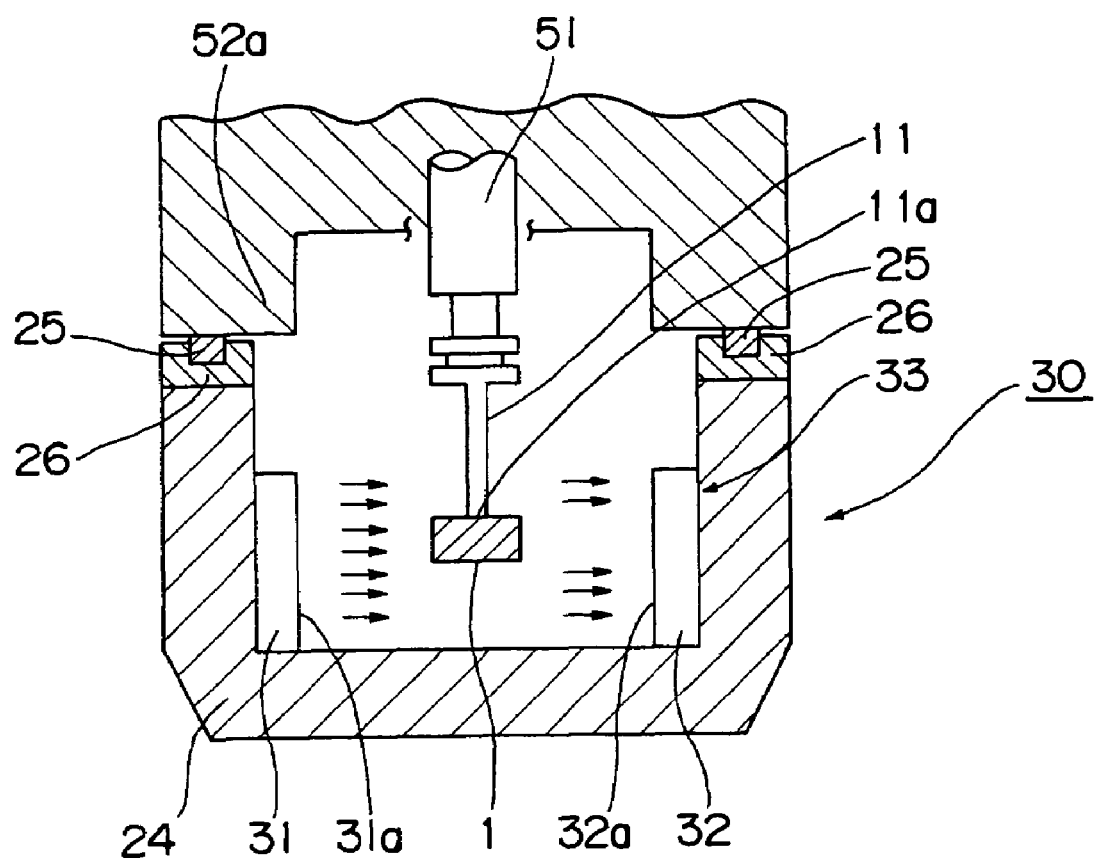
FIG. 4 is a schematic explanatory diagram of a component thickness image-pickup device in the head.
Figure 5:
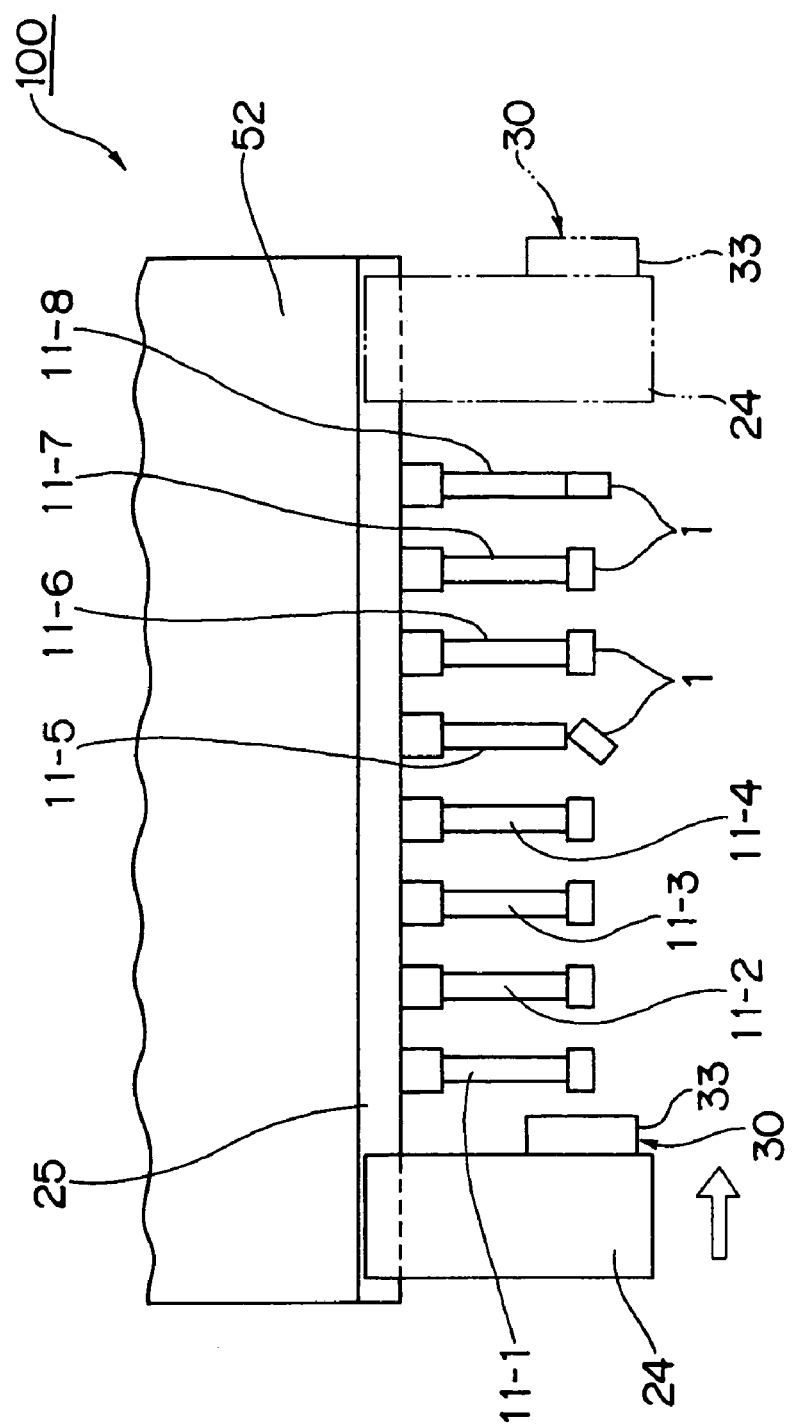
FIG. 5 is a schematic explanatory diagram of the component thickness image-pickup device moving in the directions of arrangement of the suction nozzles in the head.

As shown in FIG. 1, the component thickness image-pickup device 30 is fixed to the imaging frame 24 of the component placement surface image-pickup device 20 so as to be capable of sliding in the direction of the arrangement with the sliding movement of the imaging frame 24. As schematic explanatory diagrams illustrating a schematic structure of the component thickness image-pickup device 30, FIG. 4 shows a schematic explanatory diagram as seen from the same direction as the head 100 is seen in FIG. 3, and FIG. 5 shows a schematic explanatory diagram as seen from the same direction as the head 100 is seen in FIG. 1. FIG. 4 and FIG. 5 are drawings intended mainly for explaining the structure of the component thickness image-pickup device 30, and the camera 23, and the like, of the component placement surface image-pickup device 20 are therefore omitted in the drawings.

As shown in FIG. 4, the component thickness image-pickup device 30 has a line sensor 33 including a phototransmitter 31 and a photoreceiver 32 that are arranged so as to face each other with the interposition of each of the suction nozzles 11 arranged in a row, and the phototransmitter 31 and the photoreceiver 32 are fixed to the imaging frame 24 while keeping the arrangement. More particularly, the heights at which the phototransmitter 31 and the photoreceiver 32 in the line sensor 33 are installed are preferably generally the same and, in the embodiment, the holding surface 11a of each suction nozzle 11 in a state in which an image of an electronic component 1 thereon can be captured is in the vicinity of a height generally at a midpoint between the phototransmitter 31 and the photoreceiver 32. The phototransmitter 31 and the photoreceiver 32 are arranged and fixed to the imaging frame 24 so that a light emitting surface 31a for emitting light in the phototransmitter 31 and a light receiving surface 32a for receiving the emitted light in the photoreceiver 32 face are generally parallel with each other. With this arrangement of the phototransmitter 31 and the photoreceiver 32, light can be emitted from the light emitting surface 31a of the phototransmitter 31 onto an electronic component 1 (sucked and held by a suction nozzle 11) positioned between the phototransmitter 31 and the photoreceiver 32 in the line sensor 33, and the emitted light can be received by the light receiving surface 32a of the photoreceiver 32 while a portion of the light is interrupted by the electronic component 1 (e.g., in accordance with a shape thereof seen from a direction of a thickness thereof).

As described the above, the line sensor 33 is fixed to the imaging frame 24, so that the line sensor 33 can be slid in the direction of the arrangement with the sliding movement of the imaging frame 24 in the direction of the arrangement by the slide drive unit 27. That is, as shown in FIG. 5, the line sensor 33 can be slid and reciprocated in the direction of the arrangement between a left end position shown in the drawing (shown by solid lines) and a right end position shown in the drawing (shown by phantom lines). With this arrangement in which the line sensor 33 can be slid as described the above, the sliding movement of the line sensor 33 in the direction of the arrangement makes it possible to capture an image of an electronic component 1 held by a suction nozzle 11 of which a holding surface 11a is positioned between the phototransmitter 31 and the photoreceiver 32, out of the eight suction nozzles 11 provided in the head 100, from a direction generally orthogonal to the central axis of the nozzle and to the direction of the arrangement, that is, the image that allows recognition of a shape of the electronic component 1 as seen from the direction of the thickness thereof.

As shown in FIG. 1, the head 100 has a control unit 9 for controlling operations of the component placement surface image-pickup device 20 and the component thickness image-pickup device 30. For the component placement surface image-pickup device 20, the control unit 9 is capable of controlling image capture operations of the camera 23 including control of on/off operation of each illuminating unit and control of image capture timing, and is capable of controlling operations of the slide drive unit 27 including driving operation of the drive motor 28 and detection of a position in the sliding movement of the imaging frame 24 on the linear guide rails 25. For the component thickness image-pickup device 30, the control unit 9 is capable of controlling image capture operations of the line sensor 33 including an operation of emitting light by the phototransmitter 31 and an operation of receiving the emitted light on the photoreceiver 32.

To right of the imaging frame 24 in FIG. 3 is installed a cable bearer 55 containing a plurality of cables for transmitting control signals that are transmitted between the control unit 9 and the component placement surface image-pickup device 20 and between the control unit 9 and the component thickness image-pickup device 30, and the like. The cable bearer 55 is generally shaped like a letter "U" fallen sideways, and the cables bent in the shape of the letter "U" fallen sideways are contained in the cable bearer 55 so as not to influence the slide movement of the imaging frame 24.

Hereinbelow, a configuration of the illuminating units that are provided in the component placement surface image-pickup device 20 and that emit light required for the capture of an image of an electronic component 1 will be described with reference to FIG. 8 that is a schematic enlarged fragmentary section of the component placement surface image-pickup device 20, FIG. 9 that is a view as looking in accordance with arrows A-A in FIG. 8, and FIG. 10 that is a view as looking in accordance with arrows B-B in FIG. 8.

Figure 8:
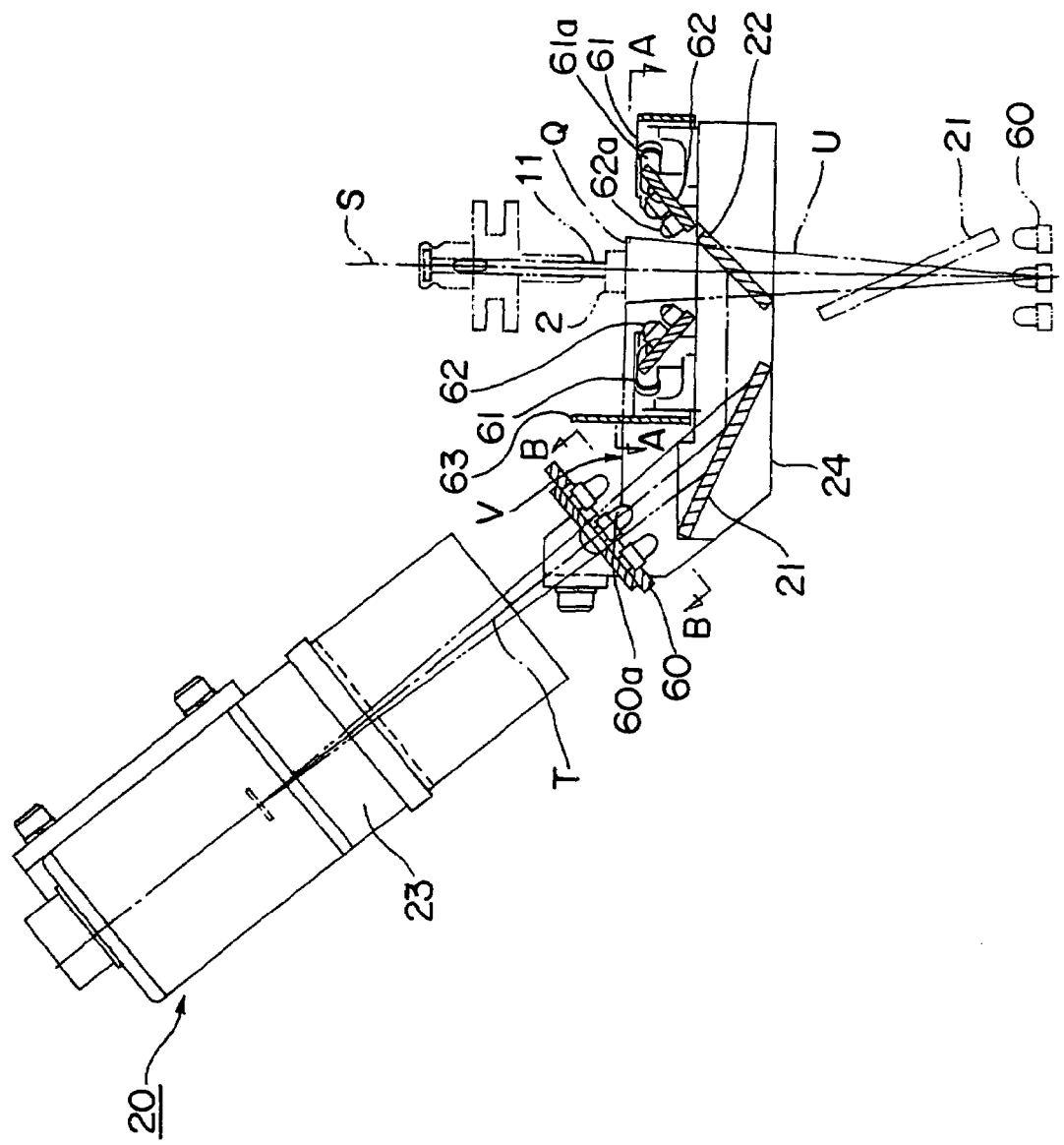
FIG. 8 is a fragmentary enlarged side view of the component placement surface image-pickup device.

As shown in FIG. 8, the component placement surface image-pickup device 20 has the camera 23 that uses as an optical axis T, an axis different from a central axis S of each suction nozzle 11 provided in the head 100 (i.e., an axis which does not coincide with the central axis), and that captures an image of an electronic component 1 sucked and held by each suction nozzle 11 from a direction along the central axis S which is reflected by the reflecting mirror 22 and the reflecting mirror 21, thereby directed along the optical axis T, and made incident along the optical axis T.

As for an electronic component 1 sucked and held by each suction nozzle 11, an image of a bottom surface thereof as a surface (that may be a plane orthogonal to the central axis S and may be a placement plane as an example of a component placement plane) Q for placement on a circuit board is captured by the camera 23 and, in the capture, light is incident from a plurality of directions in order to provide the placement surface Q with an illuminance required for the capture. The component placement surface image-pickup device 20 has, as the illuminating units for emitting such light, horizontal light emitting unit 61 that emits rays of light slightly inclined to horizontal (generally horizontal rays of light) directly onto the placement surface Q of the electronic component 1 without passage through the reflecting mirrors 21 and 22, and the like, a vertical light emitting unit 60 that emits rays of light generally along the optical axis T from vicinity of the camera 23, causes the rays of light to be reflected by the reflecting mirrors 21 and 22 and to travel in a direction along the central axis S, and emits the rays of light vertically, in general, onto the placement surface Q of the electronic component 1, and main emitting unit 62 as an example of inclined light emitting units that emit rays of light inclined at a generally medial angle between the horizontal direction and the vertical direction directly onto the component imaging surface Q of the electronic component 1 without passage through the reflecting mirrors 21 and 22, and the like. The horizontal light emitting unit 61 is capable of emitting rays of light inclined, e.g., at on the order of 10 to 20 degrees to the placement surface Q, the vertical light emitting unit 60 is capable of emitting rays of light inclined, e.g., at on the order of 70 to 80 degrees to the placement surface Q, and the main emitting unit 62 is capable of emitting rays of light inclined, e.g., at on the order of 40 to 50 degrees to the placement surface Q. As shown in FIG. 8, the horizontal light emitting unit 61 and the main emitting unit 62 are mounted and fixed onto the imaging frame 24 so as to be positioned in vicinity of the placement surface Q, and the vertical light emitting unit 60 is mounted and fixed onto the imaging frame 24 so as to be positioned in vicinity of the camera 23.

Figure 9:
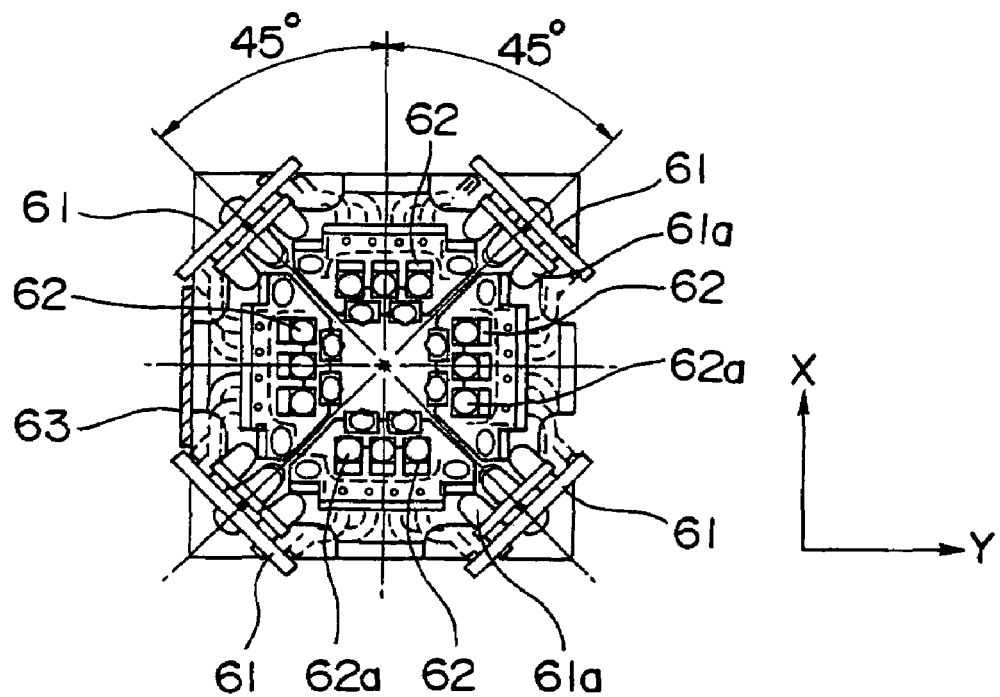
FIG. 9 is a view of horizontal light emitting units and main emitting units of the component placement surface image-pickup device as looking in accordance with arrows A-A in FIG. 8.

As shown in FIG. 8 and FIG. 9, the main emitting unit 62 has a plurality of illuminating sections 62a (e.g., composed of LEDs or the like) arranged so as to be symmetric and opposed with respect to the central axis S, as an axis of symmetry, of a suction nozzle 11 being ready for image capture, and the horizontal light emitting unit 61 has a plurality of illuminating sections 61a (e.g., composed of LEDs or the like) arranged so as to be symmetric and opposed with respect to the central axis as an axis of symmetry. As shown in FIG. 9, the illuminating sections 61a and 62a are arranged in vicinity of a periphery of a zone U in which the generally vertical light from the vertical light emitting unit 60 passes and which is formed on and around the central axis S of the suction nozzle 11, in other words, the zone U in which an image of the placement surface Q of the electronic component 1 passes. Specifically, as shown in FIG. 9, the main emitting unit 62 has, for example, two pairs of symmetric and opposed illuminating sections 62a (i.e., four illuminating sections 62a in total), and the horizontal light emitting unit 61 has, for example, two pairs of symmetric and opposed illuminating sections 61a (i.e., four illuminating sections 61a in total). On a plane extending along the placement surface Q, each pair of the illuminating sections 62a of the main emitting units 62 is arranged along each of directions of X axis and Y axis in the drawing, and each pair of the illuminating sections 61a of the horizontal light emitting units 61 is arranged along each of directions inclined generally at 45 degrees to X axis in the drawing. That is, the illuminating sections 62a of the main emitting units 62 and the illuminating sections 61a of the horizontal light emitting units 61 are alternately positioned with an angle pitch generally of 45 degrees. In FIG. 9, a height position of upper ends of the illuminating sections 62a arranged along the direction of X axis in the drawing is lower than a height position of the placement surface Q of the electronic component 1 sucked and held by the suction nozzle 11 made ready for image capture, so that a relative movement between the component placement surface image-pickup device 20 and each suction nozzle 11 in the direction of X axis in the drawing causes no interference between each electronic component 1 and each illuminating section 62a. In other words, the electronic component 1 may be defined as an electronic component of which an image can be captured by the component placement surface image-pickup device 20 and which has a height (a thickness) such that interference with the component placement surface image-pickup device 20 is avoided.

Figure 10:
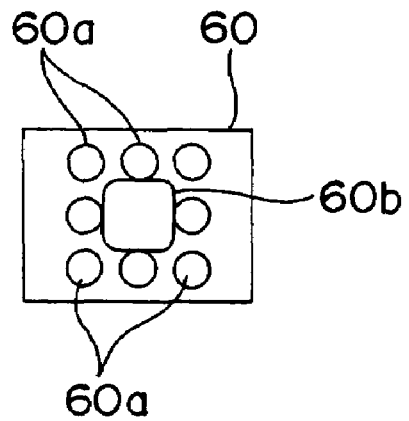
FIG. 10 is a view of a vertical light emitting unit of the component placement surface image-pickup device as looking in accordance with arrows B-B in FIG. 8.

As shown in FIG. 10, the vertical light emitting unit 60 has an aperture 60b which is formed in a center part thereof so that an image along the optical axis T may pass through the aperture 60b, and a plurality of illuminating sections 60a (e.g., composed of LEDs or the like) are provided around the aperture 60b. In FIG. 8, mirror images of the reflecting mirror 21 and of the vertical light emitting unit 60 are shown by phantom lines (chain double-dashed lines) under the imaging frame 24 in the drawing. The reflecting mirrors 21 and 22 are capable of uniformly reflecting light emitted by the vertical light emitting unit 60 and are sized so as to be capable of uniformly reflecting an image of the placement surface Q of the electronic component 1.

As shown in FIG. 8 and FIG. 9, the vertical light emitting unit 60 has a shade plate 63 that is provided on an imaginary straight line V connecting the vertical light emitting unit 60 and the placement surface Q and that interrupts light emitted from the vertical light emitting unit 60 along the imaginary straight line V. The shade plate 63 is mounted on the imaging frame 24 so as to be positioned in a vicinity of a left end of a main emitting unit 62 provided at a left end in FIG. 9. A shading width that is a width of the shade plate 63 is of generally the same size as a width of the vertical light emitting unit 60 shown in FIG. 10. Thus the interruption by the shade plate 63 of the light leaking and being emitted from the vertical light emitting unit 60 along the imaginary straight line V prevents incidence of the light on the placement surface Q of the electronic component 1 and the resultant unevenness in illumination.

In the control unit 9, recognition processing of a suction holding posture of an electronic component 1 on each suction nozzle 11 with respect to directions generally orthogonal to the central axis of the suction nozzle 11 can be executed on the basis of an image of the electronic component 1 captured by the component placement surface image-pickup device 20, and recognition processing of a suction holding posture of an electronic component 1 on each suction nozzle 11 with respect to a direction along the central axis of the suction nozzle 11 can be executed on the basis of an image of the electronic component 1 captured by the component thickness image-pickup device 30. The control unit 9 is capable of controlling the elevating operation of each elevating device 53 provided in the head 100 and the rotating operation of each rotating device 54. In the image capture, the control unit 9 is capable of controlling on/off operations in the emitting of light by the horizontal light emitting unit 61, the main emitting unit 62, and the vertical light emitting unit 60 in relation to the operation of moving the imaging frame 24.

Hereinbelow will be described operations of sucking and holding an electronic component 1 on each suction nozzle 11, capturing images of each electronic component 1 by the component placement surface image-pickup device 20 and the component thickness image-pickup device 30, recognizing a suction holding posture of each electronic component 1 on the basis of the images, and placing each electronic component 1 on a circuit board on basis of a result of the recognition, in the head 100 having the configuration described the above. Each operation in the head 100 that will be described below is controlled by the control unit 9.

In the electronic component placing apparatus (not shown) provided with the head 100, initially, the head 100 is moved to above the electronic component feeding section by the XY robot, and a holding surface 11a of each suction nozzle 11 of the head 100 is aligned, by the XY robot, with an electronic component 1 that is contained in the electronic component feeding section so as to be ready to be taken out. After the alignment, each suction nozzle 11 is lowered via each shaft 51 by each elevating device 53 in the head 100, a top surface of each electronic component 1 is thereby brought into contact with the holding surface 11a and is sucked and held, and each electronic component 1 is thereafter taken out by suction from the electronic component feeding section with elevation of each suction nozzle 11. These operations result in a status in which an electronic component 1 is sucked and held by each holding surface 11a of each suction nozzle 11 provided in the head 100. The suction holding of electronic components 1 may be performed simultaneously for all the suction nozzles 11 provided in the head 100 or, alternatively, may be performed sequentially. After the suction holding, the movement of the head 100 to above circuit boards held on the stage is started by the XY robot.

In the process of the movement of the head 100, images of a suction holding posture of each electronic component 1 that is sucked and held are captured by the component placement surface image-pickup device 20 and the component thickness image-pickup device 30 provided in the head 100.

The head 100 in which an electronic component 1 has been sucked and held by each suction nozzle 11 in this manner is in such a status as shown in the fragmentary schematic explanatory diagram of FIG. 5. In FIG. 5, the eight suction nozzles 11 provided in the head 100 are respectively referred to as a first suction nozzle 11-1, a second suction nozzle 11-2, etc., through an eighth suction nozzle 11-8, in order from left to right in the drawing.

As shown in FIG. 5, the imaging frame 24 of the component placement surface image-pickup device 20 in the head 100 is in a position in a vicinity of a left end of the linear guide rail 25 in the drawing which position is a left end position, in the drawing, of the range of the slide movement in the direction of the arrangement of the suction nozzles 11. In this status, the drive motor 28 of the slide drive unit 27 is driven to run, and a sliding movement of the imaging frame 24 in a direction of an arrow in the drawing is thereby initiated via the driving belt 29 and the arm 24a. A velocity of the movement of the imaging frame 24 by the slide drive unit 27 is set at 950 mm/s, for example.

With the initiation of the sliding movement, an electronic component 1 sucked and held by the first suction nozzle 11-1 initially passes between the phototransmitter 31 and the photoreceiver 32 of the line sensor 33 fixed to the imaging frame 24, the electronic component 1 then passes inside the imaging frame 24, and passes the optical axis of the camera 23 reflected upward by the reflecting mirror 22. With the continuous sliding movement of the imaging frame 24, the electronic component 1 sucked and held by the second suction nozzle 11-2 initially passes the line sensor 33, the electronic component 1 then passes inside the imaging frame 24, and passes the optical axis of the camera 23 reflected upward by the reflecting mirror 22. Subsequently, other electronic components 1 sequentially pass in the same manner, and thus all eight electronic components 1 are supposed to pass.

Before the electronic component 1 sucked and held by the first suction nozzle 11-1 comes into the position between the phototransmitter 31 and the photoreceiver 32 after the initiation of the sliding movement in the passage of the electronic components 1, the component thickness image-pickup device 30 is brought into a status in which light is being emitted continuously from the phototransmitter 31 to the photoreceiver 32. Timing of initiation of the emission is controlled by input into the control unit 9 of the detected positions of the imaging frame 24 on the linear guide rail 25, measurement by the control unit 9 of time having elapsed from the initiation of the sliding movement, or the like.

While the light is being emitted in the line sensor 33, each electronic component 1 passes through a space between the phototransmitter 31 and the photoreceiver 32. In each passage, a portion of the light emitted from the phototransmitter 31 is temporarily interrupted by the electronic component 1 that is passing through, and the light of which a portion has been interrupted is received by the photoreceiver 32. After all the electronic components 1 pass, the emission of the light by the phototransmitter 31 is shut off. The timing of the shutoff of the emission is controlled by the control unit 9 in the same manner as the timing of initiation of the emission.

In the component placement surface image-pickup device 20, the illuminating sections 60a, 61a, and 62a mounted on the imaging frame 24 are lighted to cast light uniformly, in general, on a placement surface Q of an electronic component 1 before the optical axis of the camera 23 reflected upward by the reflecting mirror 22 generally coincides with the central axis of the first suction nozzle 11-1 with passage inside the imaging frame 24 of the electronic component 1 sucked and held by the first suction nozzle 11-1 after the initiation of the sliding movement in the passage of the electronic components 1. When the optical axis thereafter coincides generally with the central axis of the first suction nozzle 11-1, an image of the electronic component 1 is captured via the reflecting mirror 22 and the reflecting mirror 21 by the camera 23, for example, with use of electronic shutter function or the like. When the central axis of the second suction nozzle 11-2 coincides generally with the optical axis of the camera 23, an image of the electronic component 1 sucked and held by the second suction nozzle 11-2 is captured by the camera 23 in the same manner. With continuous movement of the imaging frame 24, an image of each electronic component 1 is sequentially captured by the camera 23. After images of all the electronic components 1 are captured, the illuminating sections 60a, 61a, and 62a are shut off.

Timing of the image capture in the component placement surface image-pickup device 20 is controlled by input into the control unit 9 of detected positions of the imaging frame 24 on the linear guide rail 25, measurement by the control unit 9 of time having elapsed from the initiation of the slide movement, or the like.

For the detection of such positions, as shown in FIG. 3, an elongated plate-like linear scale 71 that is provided along the direction of the arrangement of the suction nozzles 11 and a position reading head 72 that is provided on an upper left portion (in the drawing) of the imaging frame 24 so as to face and be close to (but not in contact with) the linear scale 71 are provided on a left side surface (in the drawing) of the lower frame 52a provided with the linear guide rail 25 on the upper left side in the drawing. The position reading head 72 is slid with the sliding movement of the imaging frame 24 while facing and being close to the linear scale 71, and thus can detect a position of the frame, and can output the position to the control unit 9.

When the imaging frame 24 comes to a position in a vicinity of a right end of the linear guide rail 25 in the drawing of FIG. 5, which is a right end position, in the drawing, of the range of the sliding movement after the images of all the electronic components 1 are captured, the running of the drive motor 28 in the slide drive unit 27 and the sliding movement of the imaging frame 24 are stopped.

Each image captured by the component placement surface image-pickup device 20 and the component thickness image-pickup device 30 in this manner is sequentially outputted as image data as an example of capture result information to the control unit 9 in the sliding movement of the imaging frame 24, or after completion of the movement, and position data on a position of the imaging frame 24 on the linear guide rail 25 at each time of image capture is sequentially outputted for the control unit 9.

The control unit 9 sequentially executes recognition processing of each of the inputted image data, verifies each of the image data against the position data on a position of the imaging frame 24 which has been inputted from the position reading head 72, and recognizes which electronic component 1 held by a suction nozzle 11 corresponds to each of the image data.

Thus the control unit 9 recognizes a suction holding posture of an electronic component 1 on each suction nozzle 11 with respect to the direction generally orthogonal to the central axis of the suction nozzle 11, on the basis of the image of each electronic component 1 captured by the component placement surface image-pickup device 20, and recognizes a suction holding posture of an electronic component 1 on each suction nozzle 11 with respect to the direction along the central axis of the suction nozzle 11, on the basis of the image of each electronic component 1 captured by the component thickness image-pickup device 30 (that is, the image obtained by the interruption of the light).

The suction holding posture, recognized in this manner, of each electronic component 1 with respect to each direction and a placement posture of the electronic component 1 inputted previously into the control unit 9 are compared in the control unit 9, so that an offset between both the postures is recognized.

After that, the head 100 moved by the XY robot moves to above the circuit board to align an electronic component 1 sucked and held by a suction nozzle 11 that is to be operated for placement at the first, with a placement position on the circuit board. In the alignment, a rotating device 54 of the head 100 corrects an offset with respect to a rotational direction around the central axis of the suction nozzle 11, for example, on the basis of a quantity of the offset recognized in the control unit 9, and the XY robot corrects an offset with respect to directions parallel to a placement surface of the circuit board. Subsequently, the elevating device 53 of the head 100 lowers the suction nozzle 11 to place the electronic component 1 on the placement position and, in the lowering, the elevating device 53 corrects an offset with respect to the direction of the central axis of the suction nozzle 11. For the other suction nozzles 11, each electronic component 1 is placed on the circuit board while the corrections are performed in combination on basis of the offsets in accordance with the same steps.

Some of electronic components 1 sucked and held by the suction nozzles 11 of the head 100 may have an abnormal suction holding posture and may thus cause faulty placement on the circuit board even if the corrections are performed. Such a problem becomes remarkable with miniaturization of electronic components 1. In the head 100 shown in FIG. 5, for example, an electronic component 1 is sucked and held by the fifth suction nozzle 11-5, with a large tilt of a placement surface thereof that is to be positioned along a direction generally orthogonal to the central axis of the fifth suction nozzle 11-5. Another electronic component 1 is sucked and held by the eighth suction nozzle 11-8, with a placement surface thereof being generally parallel to the direction along the central axis of the eighth suction nozzle 11-8, that is, with a side surface of the electronic component 1 sucked and held by the holding surface 11a.

It may be difficult for the control unit 9 to recognize abnormality in the suction holding posture of the electronic component 1 sucked and held in such a status, only from an image of the electronic component 1 captured from underneath thereof by the component placement surface image-pickup device 20, and thus such an electronic component 1 may be placed without correction of the posture and may cause faulty placement.

The capture of an image of an electronic component 1 from a lateral side thereof by the component thickness image-pickup device 30 in addition to that from the underside by the component placement surface image-pickup device 20, however, makes it possible for the control unit 9 to recognize a suction holding posture of the electronic component 1 on basis of the images from two directions, i.e., from underneath and a lateral side. In a condition that there is any abnormality in either of the images from the two directions (and that the suction holding posture cannot be corrected), this arrangement makes it possible for the control unit 9 to judge the presence of an abnormality in the suction holding posture of the electronic component 1 and to prevent the faulty placement by cancellation of the placement operation of the electronic component 1, or the like, in such a case. When an abnormality, or the like, is detected in a suction holding posture of an electronic component 1, an alarm may be outputted for an operator of the electronic component placing apparatus by the control unit 9.

Figure 6:
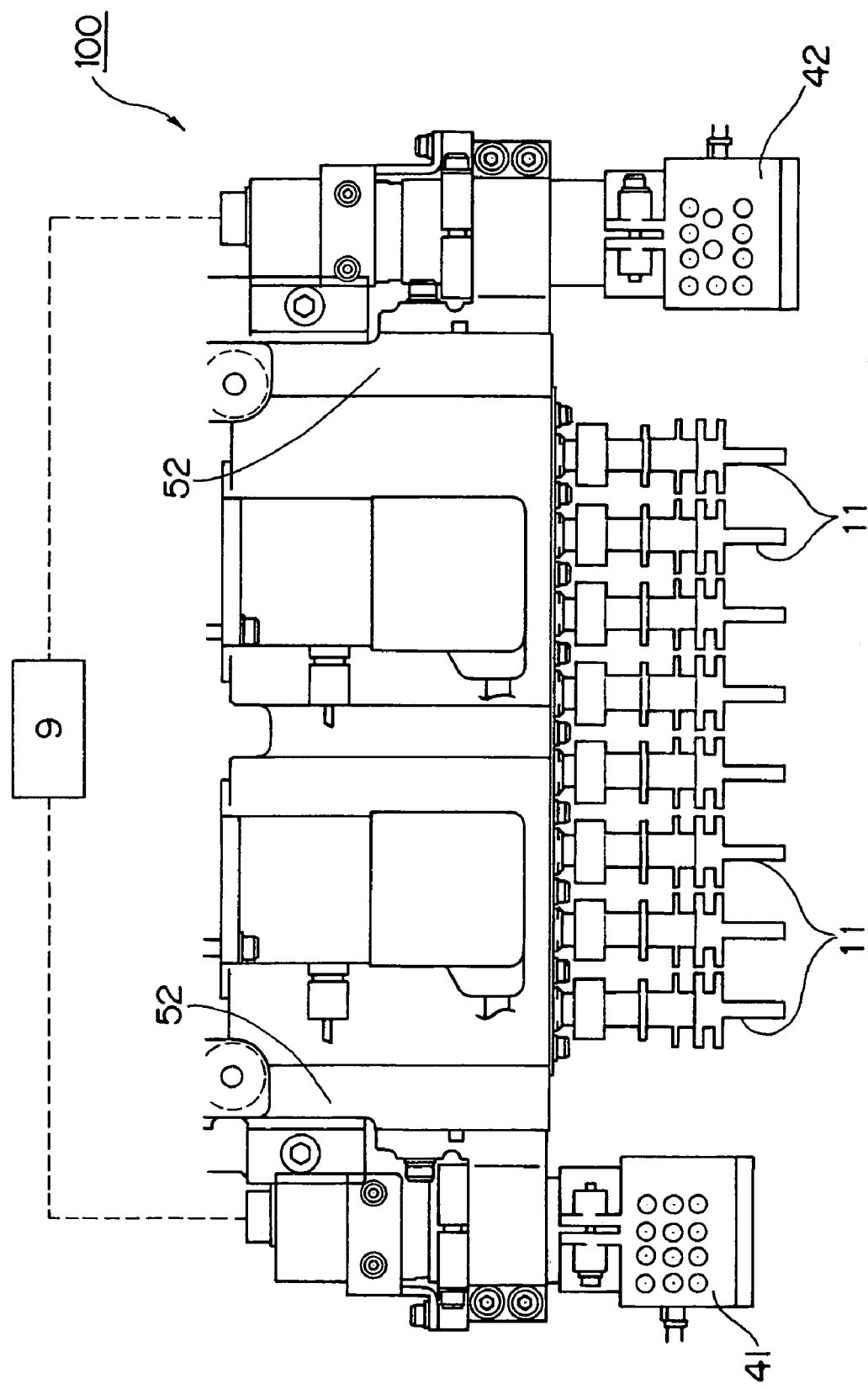
FIG. 6 is a fragmentary enlarged schematic diagram of the head provided with a first board image-pickup camera and a second board image-pickup camera.
Figure 7:
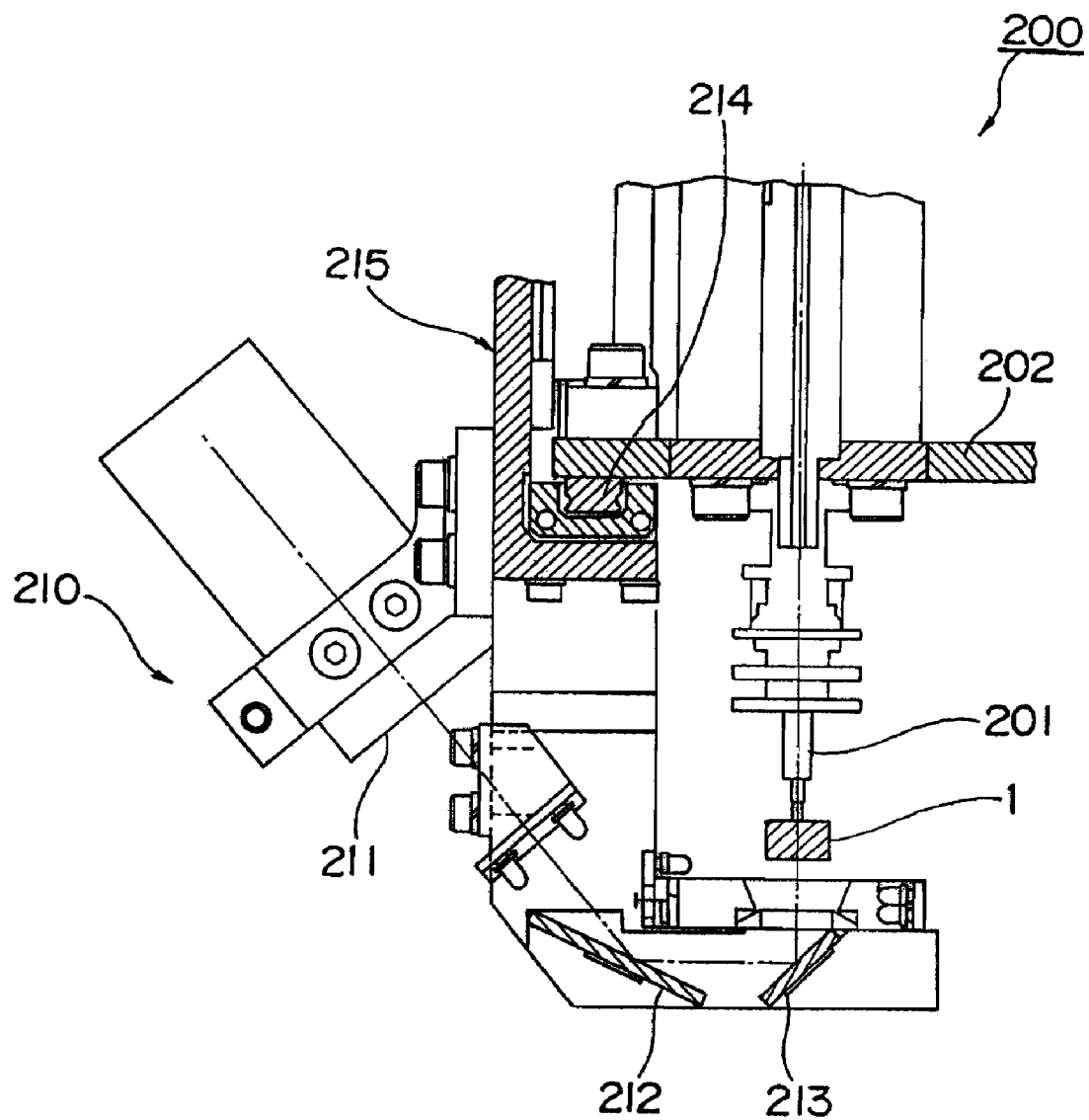
FIG. 7 is a schematic explanatory diagram of an image-pickup device in a conventional head.

The head 100 is provided with board image-pickup devices that capture an image of a board mark (as an example of a specified position on a circuit board), or the like, as a reference for determination of placement positions for electronic components 1 on the circuit board and that are capable of recognizing the placement positions on basis of the captured image of the board mark. The provision of such board image-pickup devices in the head 100 makes it possible to reliably recognize the board mark on the circuit board and to reliably place on the placement positions electronic components 1 of which suction holding postures on the suction nozzles 11 have been recognized. FIG. 6 shows a fragmentary enlarged schematic diagram of the head 100 provided with such board image-pickup devices. FIG. 6 is mainly intended for illustrating a configuration of the board image-pickup devices and is therefore made a schematic diagram in which the component placement surface image-pickup device 20 and the component thickness image-pickup device 30 provided in the head 100 are omitted. In the schematic diagram of the head 100 of FIG. 1, the board image-pickup devices are omitted similarly.

As shown in FIG. 6, a first board image-pickup camera 41 that is an example of a first board image-pickup unit and a second board image-pickup camera 42 that is an example of a second board image-pickup unit, as the board image-pickup devices, are fixed to and mounted at both left and right ends in the drawing of the head frame 52 of the head 100.

The first board image-pickup camera 41 and the second board image-pickup camera 42 are mounted on the head frame 52 so as to have optical axes generally parallel to the central axes of the suction nozzles 11 provided in the head 100, i.e., generally orthogonal to the placement surfaces of the circuit boards held on the stage of the electronic component placing apparatus and so as to be capable of capturing images of the circuit boards provided on the lower side in the drawing.

The first board image-pickup camera 41 mounted on the head frame 52 on left side in FIG. 6 has a narrower field of view for image capture and a higher resolving power than the second board image-pickup camera 42 mounted on the head frame on right side in the drawing has. Conversely, the second board image-pickup camera 42 has a wider field of view for image capture and a lower resolving power than the first board image-pickup camera 41 has.

That is, the first board image-pickup camera 41 is preferably used for the image capture from a circuit board that requires a high placement accuracy (e.g., a placement accuracy within the order of ±25 μm) for electronic components 1 to be placed, with use of performance thereof of the narrow field of view and of the high resolving power. The first board image-pickup camera 41 may be used, for example, for image capture for recognition, or the like, of the board mark on a circuit board to be subjected to narrow interval mounting of electronic components as high-density mounting with narrow placement (mounting) pitches of electronic components 1 to be placed, so-called C4 mounting that is a flip chip mounting method in which bumps are formed on electrodes of electronic components 1 with high melting solder and in which the bumps are bonded with eutectic solder onto electrodes on the circuit board, or the like.

The second board image-pickup camera 42 is used for the image capture from a circuit board that does not require the high placement accuracy for electronic components 1 to be placed and that does not have high accuracy in manufacture thereof, with use for performance thereof of the wide field of view and of the low resolving power. That is, the second board image-pickup camera 42 is preferably used in a case that stability in recognition processing of placement positions on a circuit board, or the like, is preferred to the accuracy in placement of electronic components 1. The second board image-pickup camera 42 is used, for example, for conventional circuit boards, or the like, that are not subjected to such high-accuracy mounting (placement) as narrow interval mounting and C4 mounting. Though such a conventional circuit board of which manufacturing accuracy is not so high may be held with a tilted posture or with a hold position thereof being offset in the electronic component placing apparatus, the wide field of view of the second board image-pickup camera 42 makes it possible to recognize the board mark, or the like, by the image capture in such a case.

As shown in FIG. 6, image capture operations of the first board image-pickup camera 41 and the second board image-pickup camera 42 can be controlled by the control unit 9. Such data as a placement accuracy of electronic components 1 required of a circuit board that is to be fed into the electronic component placing apparatus provided with the head 100 is inputted into the control unit 9 previously, or simultaneously with the feeding, and either the first board image-pickup camera 41 or the second board image-pickup camera 42 is chosen on the basis of the data so that control is performed over the image capture operation in the chosen board image-pickup camera.

The control unit 9 is capable of recognizing an actual hold position of the circuit board on the electronic component placing apparatus on the basis of an image of the board mark captured by the first board image-pickup camera 41, or the second board image-pickup camera 42, and recognizing a placement position of each electronic component 1 on the circuit board on the basis of a result of the recognition.

In the head 100 provided with the first board image-pickup camera 41 and the second board image-pickup camera 42, an accuracy in the recognition of a board mark on the basis of an image captured by the first board image-pickup camera 41 is on the order of ±4 μm, and an accuracy in the recognition of a board mark on the basis of an image captured by the second board image-pickup camera 42 is on the order of ±10 μm.

In a modification of the embodiment, for example, the component thickness image-pickup device 30 may have a camera similar to the camera 23 of the component placement surface image-pickup device 20, in place of the line sensor 33 composed of the phototransmitter 31 and the photoreceiver 32. That is because the modification still allows the camera to be moved in the direction of the arrangement of the suction nozzles 11 by the sliding movement of the imaging frame 24 and because an image of each electronic component 1 can be captured in the process of the movement. In this modification, preferably, an optical axis of the camera is generally orthogonal to the central axes of the suction nozzles 11 and to the direction of the arrangement thereof, and a height of the optical axis is generally the same as a height at which each electronic component 1 is sucked and held.

The camera 23 and the line sensor 33 may be slid respectively by separate drive motors, for example, instead of being slid by the same drive motor 28. This configuration increases a number of provided drive motors but has an effect of enhancing flexibility in arrangement and design of components in the head 100.

In accordance with the first embodiment, various effects can be obtained as follows.

With the head 100 having the component placement surface image-pickup device 20 that captures an image of an electronic component 1 sucked and held by each suction nozzle 11 from a direction along the central axis of the suction nozzle 11 and further having the component thickness image-pickup device 30 that captures an image of each electronic component 1 from a direction generally orthogonal to the central axis of the suction nozzle 11 and to the direction of the arrangement thereof, an image of each electronic component 1 can be captured from the two directions generally orthogonal to each other, and a suction holding posture of each electronic component 1 on a suction nozzle 11 can be recognized reliably on the basis of the images captured from the directions.

In a condition wherein an image of each electronic component 1 sucked and held is captured from the direction along the central axis, i.e., from underneath the electronic component 1 for recognition of a suction holding posture thereof, in the same manner as in conventional heads, it is difficult to recognize a suction holding posture of an electronic component 1 that is a minute electronic component such as a small chip component and that is sucked and held with a posture angled with respect to an extremity of a suction nozzle (such a case often occurs), for example, on the basis of an image captured from underneath. In the head 100 of the embodiment, by contrast, images of each electronic component 1 are captured from a direction generally orthogonal to the direction along the central axis (i.e., from a lateral direction) as well as from the direction along the central axis and a suction holding posture of the electronic component 1 is recognized also on the basis of the image from the lateral direction, so that the suction holding posture of the electronic component 1 sucked and held with an angled posture can be recognized reliably. Consequently, a suction holding posture of an electronic component 1 on each suction nozzle 11 can be recognized reliably and accurately, each electronic component 1 can be placed on a circuit board on the basis of a result of the recognition, and high-accuracy placement of electronic components can be achieved.

The component placement surface image-pickup device 20 and the component thickness image-pickup device 30 are supported by the lower frame 52a through the imaging frame 24 and the linear guide rails 25 and are provided in the head 100 so as to be capable of moving in the direction of the arrangement of the suction nozzles 11 provided in the head 100. Accordingly, the movement of the component placement surface image-pickup device 20 and the component thickness image-pickup device 30 in the direction of the arrangement makes it possible to capture from the orthogonal directions images of an electronic component 1 sucked and held by each suction nozzle 11. Such image capture operations can be performed simultaneously with the movement of the head 100 caused by the XY robot from above the electronic component feeding section to above circuit boards in the process of the movement of the head 100 after electronic components 1 are sucked and picked up by the suction nozzles 11 of the head 100 in the electronic component feeding section. As a result, an influence of the image capture operations on the operations for placing electronic components can be reduced, and efficient placement of electronic components can be achieved.

With use of the line sensor 33 as the component thickness image-pickup device 30, composed of the phototransmitter 31 and the photoreceiver 32 that are arranged so as to face each other with interposition of the electronic component 1 held by the suction nozzle 11 and that are fixed to the imaging frame 24, light emitted from the phototransmitter 31 toward the photoreceiver 32 can be received by the photoreceiver 32 for the capture of the image of the electronic component 1 with a portion of the light interrupted by the electronic component 1, and therefore a suction holding posture of the electronic component 1 can be recognized reliably and accurately from the lateral direction on the basis of a condition of the interruption of the light as a result of the image capture. The use of the line sensor 33 allows the component thickness image-pickup device 30 to be configured simply and at a low cost.

In the head 100 in which the camera 23 of the component placement surface image-pickup device 20 and the line sensor 33 of the component thickness image-pickup device 30 are fixed together to one imaging frame 24, the camera 23 and the line sensor 33 can integrally be moved with the sliding movement of the imaging frame 24, and images of an electronic component 1 sucked and held by each suction nozzle 11 can be captured almost simultaneously, in general, by the camera 23 and the line sensor 33. This decreases a time span required for the image capture so as to provide efficient image capture, and makes it possible to capture images of one electronic component 1 simultaneously, in general, from two different directions so that the suction holding posture of the electronic component 1 can be recognized more reliably.

In the capture of the images, a position in the sliding movement of the imaging frame 24 is detected by use of the linear scale 71 and the position reading head 72. A result of the detection is outputted to the control unit 9, an electronic component 1 of which the suction holding posture has been recognized can thereby be identified by the control unit 9, and thus a suction holding posture of each electronic component 1 can be recognized reliably.

The position reading head 72 capable of detecting such a position in the sliding movement is provided in neighborhood of the camera 23 of the component placement surface image-pickup device 20, and therefore a position of the camera 23 can be detected with a high accuracy.

The cable bearer 55 containing cables between the control unit 9 and the component placement surface image-pickup device 20 and between the control unit 9 and the component thickness image-pickup device 30 has a larger weight than the contained cables have. Provision of such a heavy object in a position opposite to the camera 23 with respect to the suction nozzle 11 as shown in FIG. 3 makes a satisfactory weight balance in the imaging frame 24, stabilizes the sliding movement of the imaging frame 24, and makes it possible to reliably capture images of suction holding postures of electronic components 1.

In the head 100, the drive motor 28 of the slide drive unit 27 for sliding the imaging frame 24 to which the camera 23 of the component placement surface image-pickup device 20 is fixed is not provided in a vicinity of the camera 23 but provided in a position that is opposite to the camera 23 with respect to the suction nozzles 11, and the drive motor 28 is installed on the head frame 52 in a position far from the camera 23. As for vibrations in the drive motor 28 caused in the capture of images of electronic components 1, i.e., in the sliding movement of the imaging frame 24, the above configuration can resist transmitting the vibrations to the camera 23 and can reduce the vibrations that are transmitted. As a result, an influence of the vibrations on the capture of images of electronic components 1 by the camera 23 can be reduced, the images of the electronic components 1 can be captured with a high accuracy, and suction holding postures of the electronic components 1 can be recognized with a high accuracy. For example, a repeatability accuracy (so-called 3σ) in the image capture by the component placement surface image-pickup device 20 is on the order of 5 µm, which is improved significantly in comparison with repeatability accuracy in the image capture by conventional image-pickup devices which is on the order of 30 µm.

In the component thickness image-pickup device 30 having a camera similar to the camera 23 of the component placement surface image-pickup device 20 in place of the line sensor 33 composed of the phototransmitter 31 and the photoreceiver 32, for example, provision of the camera of the component thickness image-pickup device 30 that is spaced from the drive motor 28 and that is opposite to the motor with respect to the suction nozzles 11 achieves the effect of vibration reduction also in the component thickness image-pickup device 30 and improves an accuracy in recognizing suction holding postures of electronic components 1 in the head 100.

Instead of having one board image-pickup camera capable of imaging and recognizing a board mark on a circuit board, the head 100 has two units of board image-pickup cameras having different performance, thus either of the two cameras can be used selectively in accordance with a characteristic (such as accuracy in placement of electronic components) of a circuit board fed into the electronic component placing apparatus, and efficient recognition can be performed without deteriorating an accuracy in recognizing the board mark.

Specifically, the head 100 is provided with the first board image-pickup camera 41 having a narrow field of view and a high resolving power and the second board image-pickup camera 42 having a wide field of view and a low resolving power, the control unit 9 judges which board image-pickup camera is to be used, on the basis of board data on circuit boards, or the like, inputted previously, to select a board image-pickup camera optimum for a fed circuit board, and an image of the board mark on the circuit board can be captured reliably and efficiently by the selected board image-pickup camera. That is, for a circuit board that requires a high recognition accuracy, the first board image-pickup camera 41 may be selected in order to capture an image of the board mark with a high accuracy for recognition. For a circuit board that requires reliable and stable recognition rather than recognition accuracy, the second board image-pickup camera 42 may be selected in order to capture an image of the board mark stably with the wider field of view for recognition. In the recognition of the board mark, thus recognition processing according to recognition accuracy can be executed efficiently.

The head 100 is capable of placing electronic components 1 more accurately and more efficiently with combination of the efficient and reliable recognition of the board mark according to the desired recognition accuracy by use of the first board image-pickup camera 41 and the second board image-pickup camera 42, and of the high-accuracy recognition of suction holding postures of the electronic components 1 with the use of the component placement surface image-pickup device 20 and the component thickness image-pickup device 30.

In the component placement surface image-pickup device 20 having the horizontal light emitting units 61 that emit generally horizontal rays of light onto a placement surface Q of an electronic component 1 sucked and held by a suction nozzle 11, the vertical light emitting unit 60 that emits generally vertical rays of light onto the placement surface Q, and the main emitting unit 62 that emits rays of light inclined generally at 45 degrees onto the placement surface Q, the image capture is performed by the camera 23 with the emitting units emitting rays of light on the placement surface Q of the electronic component 1, so that an image of the placement surface Q can be captured clearly. For miniaturized electronic components, electronic components with diversified shapes, or the like, in particular, the incidence of rays of light from the various directions on a placement surface Q having a miniaturized shape, a special shape, or the like, of such a component prevents occurrence of non-uniform illuminance.

In the main emitting unit 62 and the horizontal light emitting units 61 that are provided in neighborhood of an electronic component 1 sucked and held by a suction nozzle 11, the illuminating sections 62a and 61a are opposed to each other and are alternately positioned with the angle pitch generally of 45 degrees in the plane extending along the placement surface Q. Thus light from various directions can be cast uniformly on the placement surface Q of the electronic component 1 and occurrence of non-uniform illuminance can be prevented more reliably. Besides, configurations of the main emitting unit 62 and the horizontal light emitting unit 61 can be made compact, and efficient placement of components can be performed with a decrease in a vertical travel of each suction nozzle 11.

The vertical light emitting unit 60 has the shade plate 63 that is provided on the imaginary straight line V connecting the vertical light emitting unit 60 and the placement surface Q of an electronic component 1 and that interrupts light emitted from the vertical light emitting unit 60 along the imaginary straight line V. Thus the light leaking and being emitted from the vertical light emitting unit 60 along the imaginary straight line V can be interrupted by the shade plate 63 so that irradiation by the light of the placement surface Q of the electronic component 1, and the resultant unevenness in illumination, can be prevented.

In the capture of an image of each electronic component by a conventional image-pickup device (an image-pickup device corresponding to the component placement surface image-pickup device 20 of the first embodiment), the conventional image-pickup device is moved relative to the suction nozzles 11 in the direction of the arrangement of the suction nozzles, and a ball screw mechanism using a ball screw shaft and nuts screwed thereon is used as a moving device causing such a movement. With heat transfer to the ball screw shaft from the drive motor that drives and rotates the ball screw shaft, however, thermal expansion of the ball screw shaft may occur and may hinder accurate detection of positions of the nuts on the ball screw shaft, i.e., a position of the image-pickup device. Such a situation causes a problem in that accurate capture and recognition of an image of each component cannot be performed by the conventional image-pickup device and in that high-accuracy placement of components cannot be achieved.

By contrast, the slide drive unit 27 for moving the component placement surface image-pickup device 20 of the first embodiment causes the movement of the imaging frame 24 through the driving belt 29 having hard rubber, or the like, as the main material thereof, and therefore the transfer of heat from the drive motor 28 through the driving belt 29 to the imaging frame 24 can be impeded. Accordingly, the influence of heat on the camera 23 and the like can be prevented.

In the configuration in which the mechanism using the driving belt 29 is employed as the slide drive unit 27, the linear scale 71 and the position reading head 72 facing the scale are provided on the lower frame 52a so as to extend along the direction of the arrangement of the suction nozzles 11 and so as to ensure reliable detection of positions of the imaging frame 24, and thus reliable and accurate image capture can be performed with a reduced influence of heat.

Second Embodiment

The invention is not limited to the above embodiment but may be embodied in other various manners. As an example, FIG. 11 shows a schematic side view (partly in section) of a head 300 that is an example of a component placing head in accordance with a second embodiment of the present invention.

Figure 11:
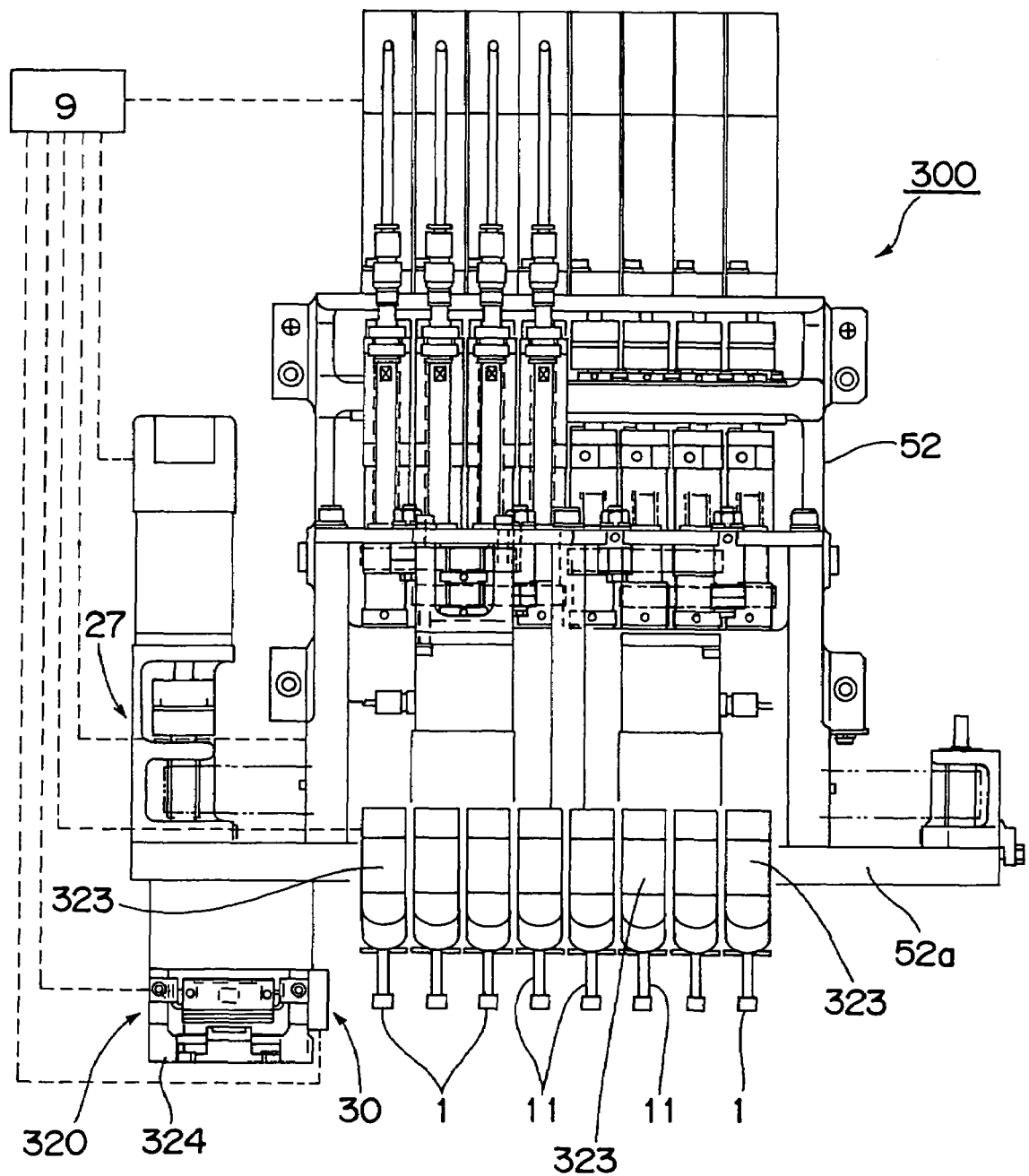
FIG. 11 is a schematic side sectional view of a head in accordance with a second embodiment of the invention.
Figure 12:
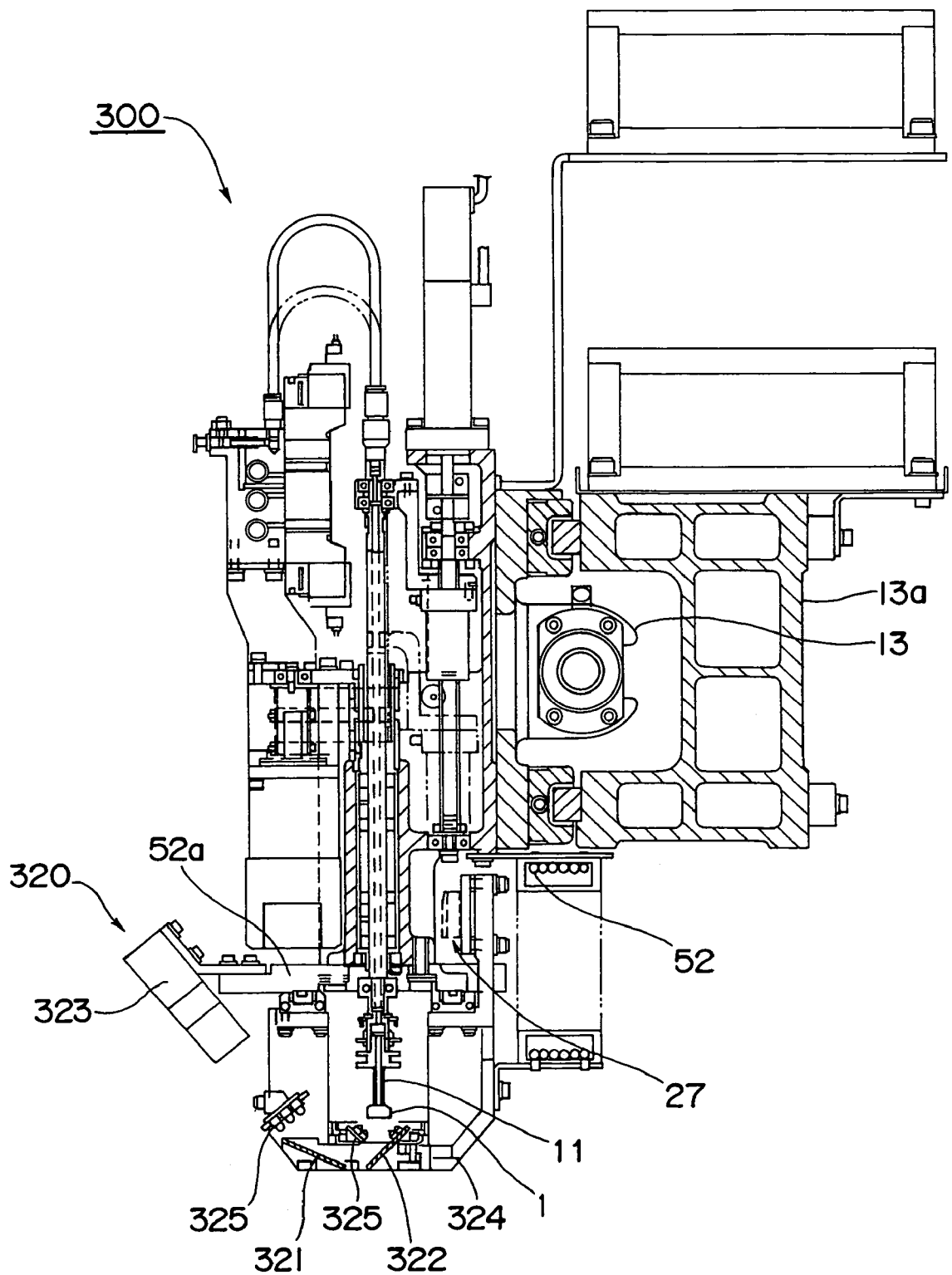
FIG. 12 is a schematic sectional view of the head of FIG. 11, taken along a plane orthogonal to directions of arrangement of suction nozzles.

As shown in FIG. 11, the head 300 has a component placement surface image-pickup device 320 with a structure different from that in the head 100 of the first embodiment, and other structures are similar to those of the head 100. In the following description, accordingly, only the different structure will be described. For elements of the head 300 that are similar to those of the head 100 of the first embodiment, the same reference characters will be used to facilitate understanding of the description of the elements. FIG. 12 shows a sectional view of the head 300 taken along a plane orthogonal to directions of arrangement of suction nozzles 11.

As shown in FIG. 11 and FIG. 12, the head 300 has eight suction nozzles 11 arranged in a row. On a lower frame 52a at a bottom of a head frame 52 is provided a component placement surface image-pickup device 320 as an example of a first component image-pickup unit that captures an image of a placement surface of an electronic component 1 held by a suction nozzle 11. The component placement surface image-pickup device 320 has eight cameras 323 as an example of a plurality of image-pickup elements fixed to the lower frame 52a, in one-to-one correspondence to the eight suction nozzles 11, instead of having one camera 23 on the imaging frame 24 as in the component placement surface image-pickup device 20 of the first embodiment. The cameras 323 are arranged in a row parallel with the direction of the arrangement of the suction nozzles 11. An imaging frame 324 that is supported by the lower frame 52a so as to be capable of moving in the direction of the arrangement of the suction nozzles 11, as is the case with the component placement surface image-pickup device 20 of the first embodiment, has the same structure as that of the component placement surface image-pickup device 20 except that the camera 23 is omitted. That is, reflecting mirrors 321 and 322, as an example of reflectors, and illuminating sections 325 (horizontal light emitting unit, main emitting unit, and a vertical light emitting unit are collectively referred to as illuminating sections 325) are fixed to and supported by the imaging frame 324 while keeping the same relative positions thereof as those in the first embodiment.

As shown in FIG. 11 and FIG. 12, the component placement surface image-pickup device 320 has a slide drive unit 27 that slides the imaging frame 324 in the direction of the arrangement of the suction nozzles 11, and the reflecting mirrors 321 and 322 and the illuminating sections 325 together with the imaging frame 324 can be slid with the sliding movement relative to the cameras 323 as well as the suction nozzles 11.

When a generally central part of the reflecting mirror 322 fixed to the imaging frame 324 comes to a position on a central axis of a suction nozzle 11 by the sliding movement of the imaging frame 324 caused by the slide drive unit 27, the central axis of the suction nozzle 11 can be reflected by the reflecting mirrors 322 and 321 so as to coincide with an optical axis of a camera 323 corresponding to the suction nozzle 11. That is, such a position produces a positional relation similar to the relation among the positions of the camera 23, the reflecting mirrors 21 and 22, and the like, in the component placement surface image-pickup device 20 of the first embodiment. Thus the reflecting mirror 322 can be positioned sequentially on a central axis of each suction nozzle 11 by the sliding movement of the imaging frame 324 caused by the slide drive unit 27, so that an image of an electronic component 1 sucked and held by each suction nozzle 11 can be captured sequentially by each camera 323.

The imaging frame 324 that is moved with the sliding movement and each camera 323 fixed to the lower frame 52a are provided so as not to interfere with each other.

By an X axis beam 13a formed of rigid members and extending in a direction of an X axis in which the suction nozzles 11 are arranged, as shown in FIG. 12, the head 300 is supported through the head frame 52 so as to be capable of moving in the X axis direction. The head 300 can be reciprocated in the X axis direction by an X axis robot 13 that is a mechanism using a ball screw shaft and nuts screwed thereon.

Figure 13:
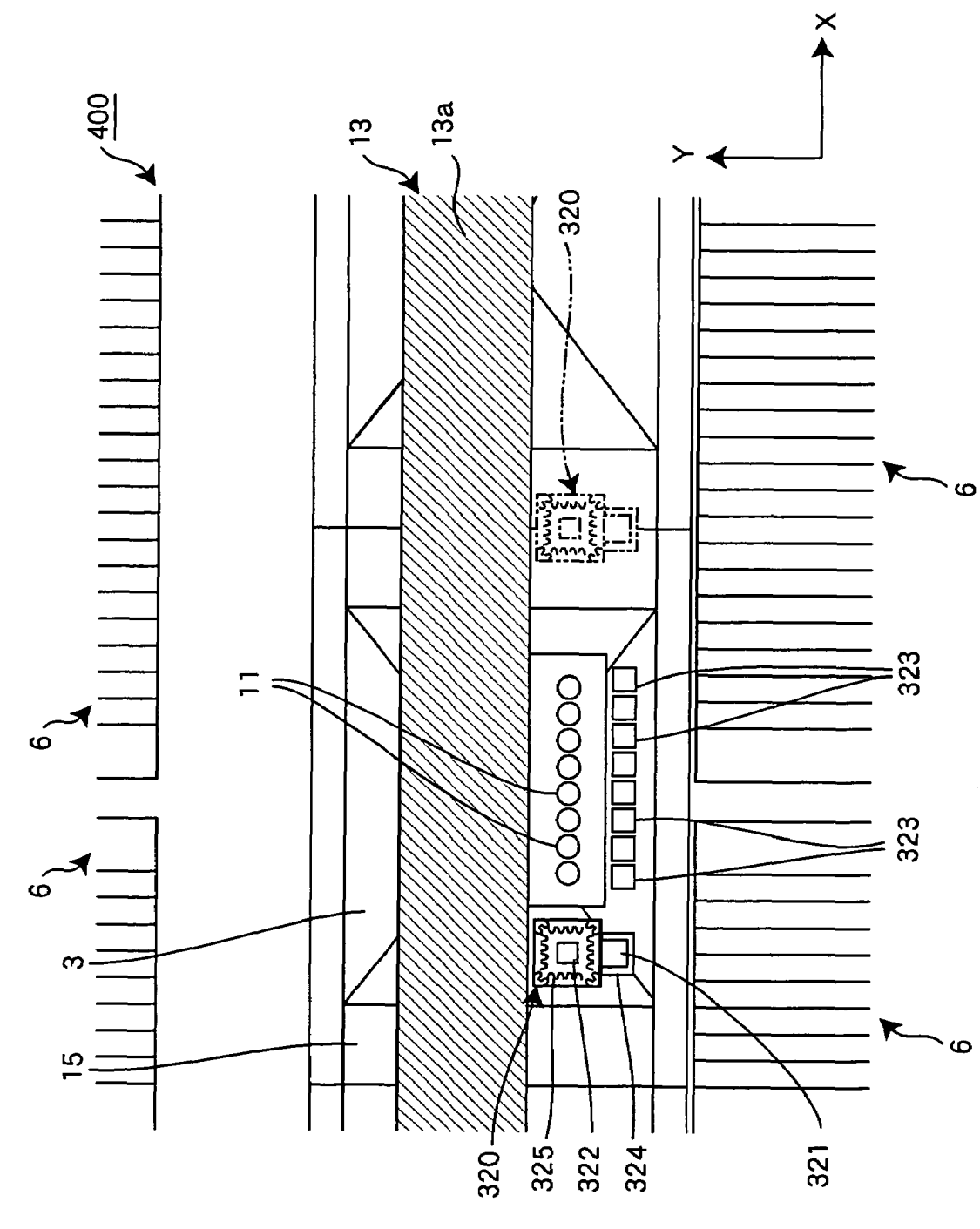
FIG. 13 is a fragmentary schematic plan view of a component placing apparatus having the head of FIG. 11.

Hereinbelow, image capture operations by the component placement surface image-pickup device 320 will be described with use of FIG. 13 showing a fragmentary schematic plan view of a component placing apparatus 400 having the head 300 configured as described the above.

As shown in FIG. 13, the component placing apparatus 400 has the X axis beam 13a by which the head 300 is supported so as to be capable of moving in an X axis direction in the drawing, the X axis robot 13 which moves the head 300 in the X axis direction in the drawing, and a Y axis robot 14 (not shown) which moves the X axis beam 13a in a Y axis direction in the drawing. The component placing apparatus 400 has a component feeding section 6 that contains a plurality of electronic components 1 so as to be capable of feeding the components, and a stage 15 that releasably holds circuit boards 3 on which the electronic components 1 are to be placed.

In FIG. 13, each suction nozzle 11 of the head 300 is initially moved to above the component feeding section 6 by the X axis robot 13 and the Y axis robot. After the movement, each suction nozzle 11 is lowered to suck and hold an electronic component 1, and is then elevated to take out the electronic component 1 from the component feeding section 6.

As shown in FIG. 13, subsequently, movement of the head 300 from the component feeding section 6 to above the circuit boards 3 held on the stage 15 is started by the X axis robot 13 and the Y axis robot. With the start of the movement, the imaging frame 324 to left of the head 300 in the drawing starts sliding rightward in the X axis direction in the drawing, by action of the slide drive unit 27.

With the start of the sliding movement, illuminating sections 325 fixed to the imaging frame 324 are lighted. When the generally central part of the reflecting mirror 322 fixed to the imaging frame 324 thereafter comes to a position on a central axis of a suction nozzle 11 provided at a left end in the drawing, an image of a placement surface of an electronic component 1 that is sucked and held by the suction nozzle 11 and that has the placement surface irradiated with light from the illuminating sections 325 is made incident through the reflecting mirrors 322 and 321 on a camera 323 corresponding to the suction nozzle 11 so as to be captured by use of an electronic shutter, or the like. With the sliding movement of the imaging frame, the reflecting mirror 322 is sequentially positioned on a central axis of each suction nozzle 11, and an image of each electronic component 1 is thereby captured by each corresponding camera 323. Image data captured by each camera 323 is sequentially outputted to a control unit 9 immediately after each image capture operation, and recognition processing of each image is executed simultaneously in the control unit 9. When the imaging frame 324 comes to a position to the right of the head 300 in the drawing after the capture of images of all the electronic components 1 is completed, the movement of the imaging frame 324 caused by the slide drive unit 27 is stopped.

When the head 300 thereafter is above the circuit board 3, a suction nozzle 11 that is to perform an initial placement is aligned with a mounting position on the circuit board 3 and placement of the electronic components 1 is sequentially performed on the basis of a result of the recognition processing in the control unit 9.

Though description has been omitted in the above, the imaging frame 324 is provided with a component thickness image-pickup device 30, as is the case with the first embodiment, and a suction holding posture of each electronic component 1 is recognized by the component thickness image-pickup device 30 also, with the capture of an image of a placement surface of each electronic component 1.

For each camera 323 a so-called shutter camera may be used, characterized in that a time span required for capture of an image is short. Among such shutter cameras is a CCD camera according to NTSC specifications, for example. In such a shutter camera in which an electronic shutter is used, a period of time during which an image is captured in a CCD is electrically controlled, and the CCD is exposed to light only for the period of time for the image capture. A quantity of light required for the exposure is an integral of emission intensities of LEDs used in the illuminating sections 325 and of emission time. Movement of an object for image capture relative to the camera during the exposure blurs the captured image by a quantity of the movement. In a condition that an electronic component 1 as an object for image capture moves approximately at 950 mm/s as in the first embodiment, for example, the exposure for 50 μs blurs the captured image by approximately 50 μm. As seen by experience, however, it has been found that image capture with blur of the image on the order of 50 μm does not influence an accuracy in placement of electronic components 1. In the first embodiment, light is emitted from the LEDs for periods of time preceding and following the exposure also, for allowances, in order that the quantity of light for the exposure may be ensured reliably, and the light emission from the LEDs lasts on the order of 100 μs as a result. With use of the electronic shutter, the exposure time can be reduced by momentary illumination of an object with a large quantity of light, for accurate image capture; however, emission intensities of such LEDs are inversely proportional to life spans of the LED.

In the second embodiment, by contrast, relative positions between each suction nozzle 11 and each camera 323 are fixed, so that the exposure time is allowed to be extended with a decrease in the emission intensity of the LEDs in the illuminating sections 325. Thus life spans of the LEDs can be extended. For example, each image can be captured in an exposure time of 200 μs, an emission intensity of the LEDs reduced to a quarter that in the first embodiment, and an illuminating time of 300 μs.

In place of such a configuration as described above, other conventional cameras may be used. The use of such cameras has advantages in that a cost of such a camera is smaller than that of a shutter camera and in that a conventional camera does not require such a high momentary illuminance for image capture as a flash-type camera requires, and allows further reduction in the emission intensity of the LEDs, and thus extends the life span of the illuminating sections 325.

In accordance with the second embodiment in which the cameras 323 are fixed to the lower frame 52$a$ of the head 300, the cameras 323 are stationary without moving during the image capture. Accordingly, influences, such as vibrations, of the movement of the cameras 323 can be prevented from occurring, and high-accuracy image capture can be achieved.

The cameras 323 are provided in one-to-one correspondence to the suction nozzles 11 provided in the head 300, and therefore positional relations between the suction nozzles 11 and the cameras 323 can be secured stably at all times, so that stable image capture can be achieved.

The positional relations between the suction nozzles 11 and the cameras 323 are fixed, and thus the image capture can be performed if only a generally central part of the reflecting mirror 322 fixed to the imaging frame 324 is positioned on a central axis of a suction nozzle 11. Accordingly, the high-accuracy slide movement of the imaging frame 324 by the slide drive unit 27 may be unnecessary, and the necessity of the high-accuracy linear scale 71 can be obviated. For example, the linear scale or the like may have only to have an accuracy on such order as ensures position detection to some extent or the linear scale itself may be omitted.

With the cameras 323 provided in one-to-one correspondence, relevant image data can be outputted for the control unit 9 and recognition processing can be started immediately after the image capture operation is completed in each camera 323. Accordingly, recognition processing of the images can be started in the control unit 9 before completion of the capture of all the images, so that a time span from the image capture to completion of the recognition processing can be shortened. As a result, efficient placement of electronic components can be achieved.

Besides, cameras 323 that do not move eliminate the necessity to move control cables and the like connected to the cameras 323. In particular, heavy and thick cables called shielding wires are used as such control cables for EMC (electromagnetic compatibility), and the elimination of the movement of the cables allows a power of the slide drive unit 27 to be reduced.

The removal of the cameras 323 from the imaging frame 324 that is slid by the slide drive unit 27 allows a power of the slide drive unit 27 to be reduced and allows a velocity of the frame to be increased for efficient image capture.

Appropriate combinations of arbitrary embodiments of the various embodiments described the above are capable of achieving the effects which the combined embodiments have.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component placing method comprising:
    holding each of the plurality of components releasably by a respective component holding member of a plurality of component holding members, each component holding member of the plurality of component holding members having a central axis and the plurality of component holding members being arranged in a row;
    sequentially capturing an image of each component from a direction along the central axis of the respective component holding member and sequentially capturing an image of each component from a direction generally orthogonal to both the central axis of the respective component holding member and a direction of the arrangement of the plurality of component holding members;

recognizing a holding posture of each component on the respective component holding member on a basis of the image captured from the direction along the central axis of the respective component holding member and the image captured from the direction generally orthogonal to both the central axis of the respective component holding member and the direction of the arrangement of the plurality of component holding members;

and placing each component on a circuit board on a basis of the recognized holding posture of each component on the respective component holding member, wherein the image of each component from the direction along the central axis of the respective component holding member is an image of a component imaging plane of a respective component of the plurality of components, the component imaging plane of the respective component being a plane orthogonal to the central axis of the respective component holding member and being a placement surface of the respective component upon which light is incident, and wherein the image of the component imaging plane of each component is captured in a state in which a horizontal light emitting unit emits rays of horizontal light in a generally parallel direction to the component imaging plane, a vertical light emitting unit emits rays of vertical light in a generally orthogonal direction to the component imaging plane, and an inclined light emitting unit emits rays of light inclined at a generally medial angle between the rays of horizontal light and the rays of vertical light, simultaneously and directly illuminating the component imaging plane of each component.

2. A component placing method as defined in claim 1, wherein the holding posture of each component on the respective component holding member with respect to directions generally orthogonal to the central axis of the respective component holding member can be recognized on a basis of the image of each component captured from the direction along the central axis of the respective component holding member, and wherein the holding posture of each component on the respective component holding member with respect to directions along the central axis of the respective component holding member can be recognized on a basis of the image of each component captured from the direction generally orthogonal to both the central axis of the respective component holding member and the direction of the arrangement of the plurality of component holding members.

* * * * *